United States Patent
Matsubara et al.

(10) Patent No.: US 9,947,409 B2
(45) Date of Patent: Apr. 17, 2018

(54) FLASH MEMORY

(71) Applicant: RENESAS ELECTRONICS CORPORATION, Tokyo (JP)

(72) Inventors: Ken Matsubara, Tokyo (JP); Takashi Iwase, Tokyo (JP); Satoru Nakanishi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/432,228

(22) Filed: Feb. 14, 2017

(65) Prior Publication Data
US 2017/0236587 A1    Aug. 17, 2017

(30) Foreign Application Priority Data
Feb. 16, 2016    (JP) .................. 2016-026690

(51) Int. Cl.
| G11C 11/34 | (2006.01) |
| G11C 16/08 | (2006.01) |
| G11C 16/04 | (2006.01) |
| H03K 3/356 | (2006.01) |

(52) U.S. Cl.
CPC .......... *G11C 16/08* (2013.01); *G11C 16/0416* (2013.01); *G11C 16/0433* (2013.01); *H03K 3/356104* (2013.01)

(58) Field of Classification Search
CPC .. G11C 16/08; G11C 16/0433; G11C 16/0416
USPC ............................ 365/185.23, 185.11, 230.06
See application file for complete search history.

(56) References Cited

U.S. PATENT DOCUMENTS

| 5,812,483 | A * | 9/1998 | Jeon | G11C 8/08 365/189.11 |
| 5,923,593 | A * | 7/1999 | Hsu | G11C 8/16 365/149 |
| 5,963,467 | A * | 10/1999 | Miyatake | G11C 11/22 365/145 |
| 6,091,620 | A * | 7/2000 | Kablanian | G11C 5/025 365/189.02 |
| 6,198,634 | B1 * | 3/2001 | Armezzani | H01L 23/49816 174/255 |
| 6,337,806 | B1 * | 1/2002 | Yoon | G11C 7/1006 365/149 |
| 6,738,279 | B1 * | 5/2004 | Kablanian | G11C 5/025 365/230.03 |
| 7,345,946 | B1 * | 3/2008 | Chapman | G11C 8/08 365/189.11 |
| 7,800,407 | B1 * | 9/2010 | Agarwal | H03K 19/018521 326/68 |

(Continued)

FOREIGN PATENT DOCUMENTS

JP    2014-010866 A    1/2014

*Primary Examiner* — Viet Q Nguyen
(74) *Attorney, Agent, or Firm* — McDermott Will & Emery LLP

(57) ABSTRACT

In order to reduce the manufacturing cost, a flash memory includes a memory cell array formed by a plurality of memory cells arranged in a matrix shape; a plurality of word lines provided in each column of the memory cell array; a first word line driver that outputs a first voltage group to each of the word lines; and a second word line driver that outputs a second voltage group to each of the word lines together with the first word line driver.

11 Claims, 23 Drawing Sheets

(56) References Cited

U.S. PATENT DOCUMENTS

| | | | | |
|---|---|---|---|---|
| 8,837,226 B2* | 9/2014 | McCombs | ............... | G11C 8/08 365/185.23 |
| 9,343,166 B2 | 5/2016 | Kasai et al. | | |
| 9,466,347 B1* | 10/2016 | Pasotti | ............... | G11C 13/0028 |
| 9,503,091 B2* | 11/2016 | Kirihata | ......... | H03K 19/017509 |
| 2002/0075249 A1* | 6/2002 | Kubota | ................ | G09G 3/2011 345/204 |
| 2004/0125648 A1* | 7/2004 | Iwata | ...................... | G11C 11/15 365/158 |
| 2007/0008807 A1* | 1/2007 | Jeong | ....................... | G11C 8/14 365/230.06 |
| 2007/0258312 A1* | 11/2007 | Richards | ............ | G02B 26/0841 365/230.03 |
| 2009/0185422 A1* | 7/2009 | Kang | ....................... | G11C 7/02 365/185.11 |
| 2010/0214838 A1* | 8/2010 | Hishida | .................... | G11C 8/08 365/185.11 |
| 2011/0032785 A1* | 2/2011 | Cho | ........................ | G11C 8/08 365/230.06 |
| 2011/0069558 A1* | 3/2011 | Liao | ........................ | G11C 8/14 365/185.23 |
| 2011/0286262 A1* | 11/2011 | Kitayama | ................ | G11C 7/02 365/149 |
| 2012/0033522 A1* | 2/2012 | Chuang | ................ | G11C 11/413 365/230.06 |
| 2013/0155801 A1* | 6/2013 | Yun | ........................ | G11C 8/08 365/230.06 |
| 2013/0286754 A1* | 10/2013 | Jung | ........................ | G11C 8/08 365/189.06 |
| 2014/0104948 A1* | 4/2014 | Rhie | ........................ | G11C 8/08 365/185.11 |
| 2017/0169874 A1* | 6/2017 | Dray | ................... | G11C 11/1697 |

\* cited by examiner

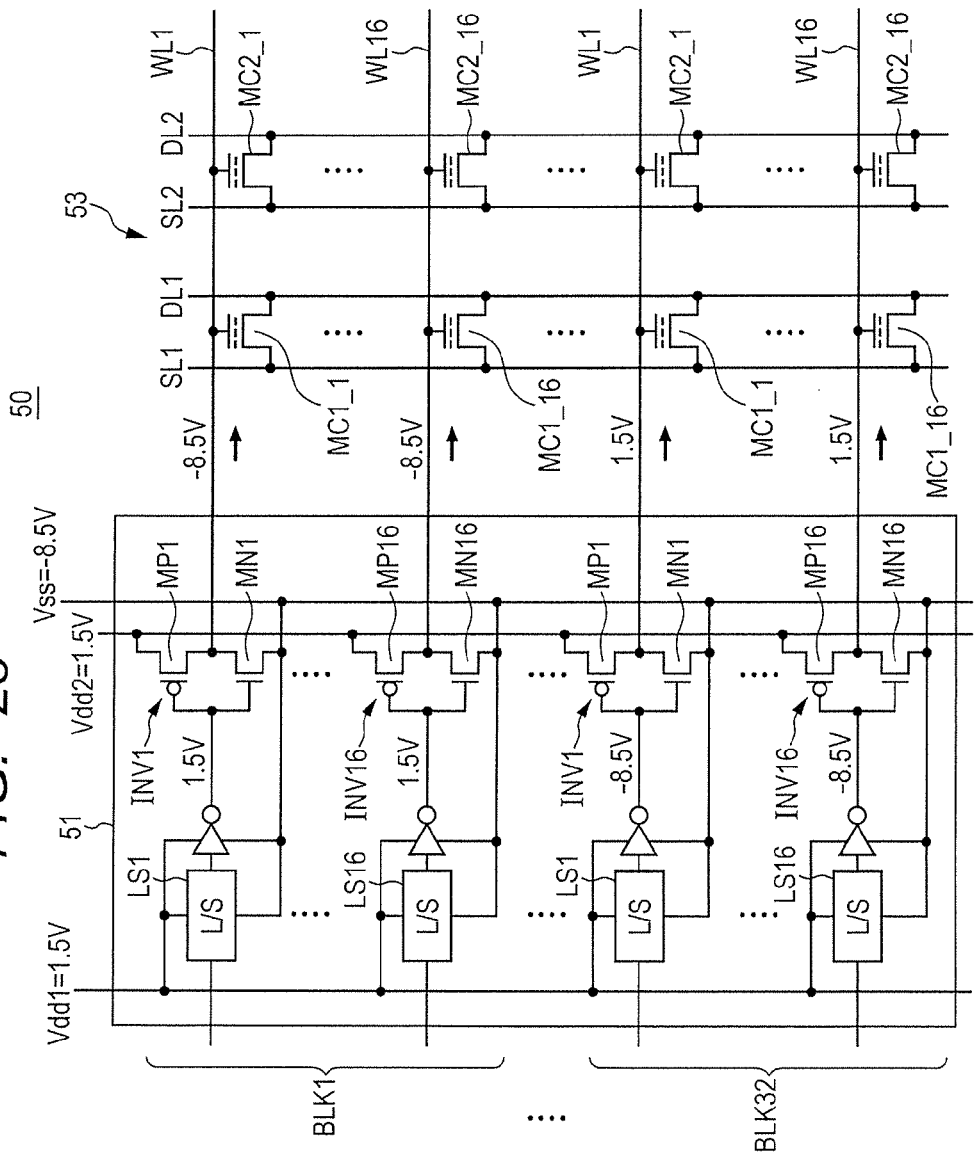

// FLASH MEMORY

CROSS-REFERENCE TO RELATED APPLICATIONS

The disclosure of Japanese Patent Application No. 2016-026690 filed on Feb. 16, 2016 including the specification, drawings and abstract is incorporated herein by reference in its entirety.

BACKGROUND

The invention relates to a flash memory and, for example, a flash memory suitable for reducing the manufacturing cost.

In a flash memory, a high voltage has to be applied to a memory cell in order to rewrite data stored in the memory cell. Therefore, a peripheral circuit such as a word line driver for driving a high voltage has to be formed by using a MOS transistor (high breakdown voltage transistor) having a breakdown voltage enough to endure the high voltage.

SUMMARY

When forming a word line driver using a high breakdown voltage, the manufacturing process of a semiconductor device having a flash memory mounted there needs the process of faulting a high breakdown voltage transistor, separately from the process of forming a low breakdown voltage transistor used in a large part of the peripheral circuit. Accordingly, there is a problem such as increasing the manufacturing cost in the method of forming a word line driver using a high breakdown voltage transistor. According to a decrease in the rate of the area of a flash memory occupying the chip area of a semiconductor device, an increase in the manufacturing cost becomes significant. Other problems and novel features will be apparent from the description of the specification and the drawings.

According to one embodiment, a flash memory includes a memory cell array formed by a plurality of memory cells arranged in a matrix shape; a plurality of word lines provided in each column of the memory cell array; a first word line driver that outputs a first voltage group to each of the word lines; and a second word line driver that outputs a second voltage group to each of the word lines together with the first word line driver.

According to the embodiment, it is possible to provide a flash memory capable of reducing the manufacturing cost.

BRIEF DESCRIPTION OF THE DRAWINGS

FIG. 23 is a view showing the voltage application state at a time of data erasing in the flash memory shown in FIG. 21.

DETAILED DESCRIPTION

Hereinafter, with reference to the drawings, embodiments will be described. Although the drawings are simple; the technical range of the embodiments should not be interpreted narrowly just because of the simple description of the drawings. The same reference symbols are attached to the same elements and their repeated description is omitted.

The following embodiments, if the necessity arises for the sake of convenience, will be described divided into a plurality of sections or forms; unless otherwise specified, they are mutually related to each other and one is related to the other in a part or in the whole of the modified examples or application examples as the detailed and supplementary description. Further, in case of referring to the number of the elements (including piece, numeric value, amount, and range), in the following embodiments, the number is not restricted to the specified number but may be more or less than the specified number, unless particularly specified and unless restricted to the specified number apparently on the principle.

Further, in the following embodiments, the component elements (including operation step) are not always essential unless particularly specified and unless apparently considered compulsory on the principle. Similarly, in the following embodiments, when referring to the shape and the positional relation of the component elements, they are to include their similarity or approximation unless particularly specified and unless they have apparently different shape and positional relation on the principle. This is true to the above number (including piece, numeric value, amount, and range).

<Previous Consideration by the Inventor et al.>

Before describing the details of a flash memory according to a first embodiment, a flash memory 50 examined by the inventor et al. previously will be described.

Figure 21:
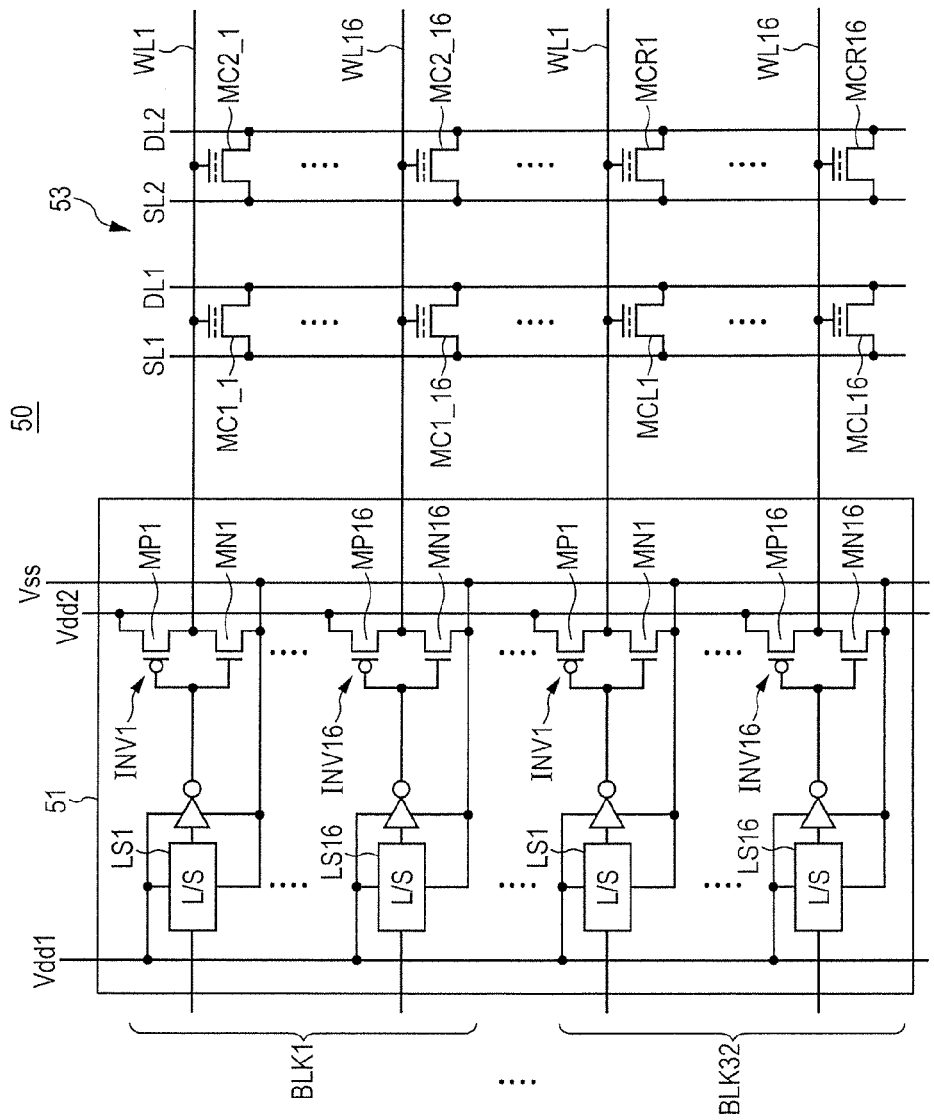
FIG. 21 is a view showing the constitutional example of a flash memory according to the conception before arriving at the embodiments.

FIG. 21 is a view showing the constitutional example of the flash memory 50 related to the concept before arriving at the embodiments. As shown in FIG. 21, the flash memory 50 includes a memory cell array 53 formed by a plurality of memory cells MC arranged in an array shape, a plurality of word lines WL respectively provided in each column of the memory cells MC, a plurality of bit line pairs DL and SL respectively provided in each row of the memory cells MC, and a word line driver 51 for supplying a voltage to each of the word lines WL depending on a voltage signal from the outside.

In the example of FIG. 21, memory cells MC of 512 columns×2 rows, word lines WL in 512 columns, and bit line pairs DL and SL in two rows are provided. Here, of a plurality of memory cells MC, a group of the memory cells MC in which memory data is erased together at a time of data erasing and its peripheral circuit are referred to as a block BLK. In this example, there are provided with 32 blocks BLK each including a group of 32 memory cells MC (hereinafter, also referred to as memory cells MC1_1 to MC1_16, MC2_1 to MC2_16) coupled to the adjacent 16 word lines WL (hereinafter, also referred to as word lines WL1 to WL16) and its peripheral circuit. Hereinafter, 32 blocks BLK are also referred to as blocks BLK1 to BLK32. Needless to say, the number of the memory cells MC can be set freely.

Each memory cell MC is formed by, for example, a high breakdown voltage N channel MOS transistor. The corresponding word line WL is coupled to the gate of each memory cell MC, the corresponding bit line SL is coupled to the source, the corresponding bit line DL is coupled to the drain.

The word line driver 51 includes 512 level shifters LS and 512 inverters INV provided correspondingly to 512 word lines WL. In short, the word line driver 51 includes 16 level shifters LS (hereinafter, referred to as level shifters LS1 to LS16) and 16 inverters INV (hereinafter, referred to as inverters INV1 to INV16), in every block of BLK1 to BLK32.

Hereinafter, the structure of the block BLK1 portion of the word line driver 51 will be described.

The level shifters LS1 to LS16 shift the maximum voltage value and the minimum voltage value of an external access signal (address signal, command signal, and enable signal, etc.) to a value depending on the operation mode (data erasing, data writing, or data reading). The inverters INV1 to INV16 respectively invert the inversion signals of the outputs from the level shifters LS1 to LS16 in the respective former stages and output the above to the corresponding word lines WL1 to WL16. In short, the inverters INV1 to INV16 drive and output the output signals from the respective level shifters LS1 to LS16 in the respective former stages to the corresponding word lines WL1 to WL16.

Every inverter INV1 to INV16 is formed by a P channel MOS transistor and an N channel MOS transistor. Hereinafter, the P channel MOS transistor and the N channel MOS transistor faulting the inverter INVi (i is an integer of 1 to 16) is referred to as transistor MP1 and transistor MNi.

The structure of the blocks BLK2 to BLK32 of the word line driver 51 is basically the same as the structure of the block BLK1 of the word line driver 51 and therefore, the description is omitted.

(Operation of Flash Memory 50)

Figure 22:
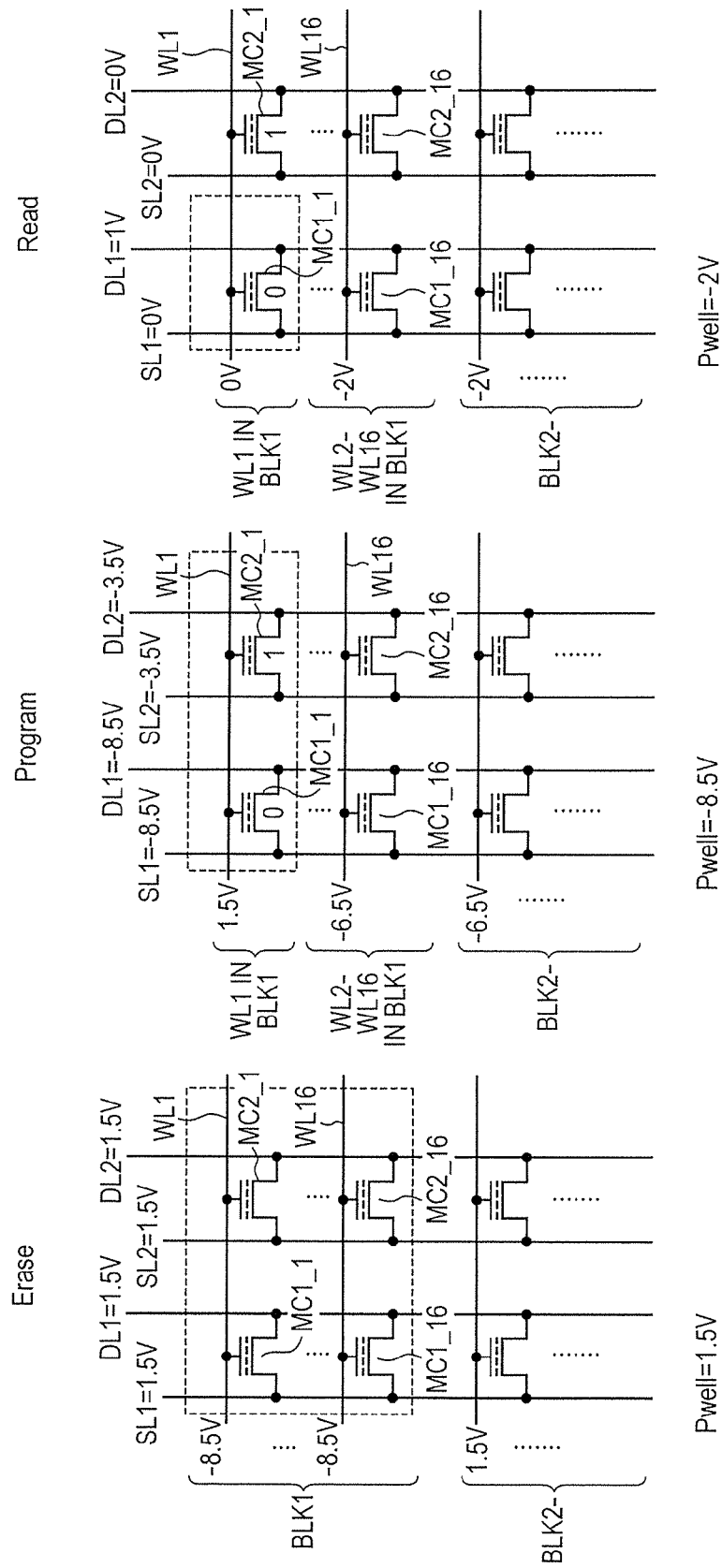
FIG. 22 is a view showing the voltage application state in each operation mode in the flash memory shown in FIG. 21.

Continuously, referring to FIG. 22, the operation of the flash memory 50 will be described. FIG. 22 is a view showing the voltage application state in each operation mode of the flash memory 50.

A rewriting operation of data stored in the flash memory 50 will be described. In the rewriting of the memory data, after the memory data is erased by the unit of block, the memory data is written by the unit of the word line.

For example, when the data stored in each memory cell MC of the block BLK1 is rewritten, at first the data stored in each memory cell MC of the block BLK1 is erased together at once. Specifically, a higher voltage is applied to each source than to each gate of the memory cells MC1_1 to MC1_16, and MC2_1 to MC2_16 belonging to the block BLK1.

In the example of FIG. 22, the potentials of all the bit line pairs SL1 and DL1 to SL2 and DL2 are set at 1.5 V, the potential of the P well where to form the memory cell array 53 is set at 1.5 V, the potentials of the word lines WL1 to WL16 in the block BLK1 targeted for data erasing are set at −8.5 V, and the potentials of the word lines WL1 to WL16 in each of the blocks BLK2 to BLK32 excluded from the data erasing are set at 1.5 V. According to this, a higher voltage by 10 V is applied to each source than to each gate of the memory cells MC1_1 to MC1_16 and MC2_1 to MC2_16 belonging to the block BLK1.

According to this, in the memory cell with "0" stored, of the memory cells MC1_1 to MC1_16 and MC2_1 to MC2_16 belonging to the block BLK1, electrons accumulated in the floating gate are drawn to the side of the source and the memory data is rewritten from "0" to "1". In short, all the memory data of the memory cells MC1_1 to MC1_16 and MC2_1 to MC2_16 belonging to the block BLK1 is rewritten to "1" (in short, erased together at once).

Then, the memory data is written in the memory cell by the unit of the word line.

Specifically, data is written in the memory cells MC1_1 and MC2_1 coupled to the word line WL1 in the block BLK1. For example, when "0" is written in the memory cell MC1_1 and "1" is written in the memory cell MC2_1, a quite higher voltage is applied to the gate than to the source of the memory cell MC1_1. On the other hand, a higher voltage is not applied to the gate than to the source of the memory cell MC2_1.

In the example of FIG. 22, the potentials of the bit line pair SL1 and DL1 are set at −8.5 V, the potential of the P well is set at −8.5 V, the potentials of the bit line pair SL2 and DL2 are set at −3.5 V, and the potential of the word line WL1 in the block BLK1 is set at 1.5 V. According to this, a higher voltage by 10 V is applied to the gate than to the source of the memory cell MC1_1 belonging to the block BLK1. On the other hand, a higher voltage by only 5 V is applied to the gate than to the source of the memory cell MC2_1 belonging to the block BLK1.

According to this, in the memory cell MC1_1 belonging to the block BLK1, since the electrons drawn from the source to the gate are taken in the floating gate, the data of "0" is written. On the other hand, in the memory cell MC2_1 belonging to the block BLK1, since the electrons drawn from the source to the gate are not taken in the floating gate, the memory data of "1" is kept.

In the example of FIG. 22, the potential of each word line WL other than the word line WL1 in the block BLK1 is set at −6.5 V. According to this, a higher voltage by 2 V or a lower voltage by 3 V is applied to each gate than to each source of the memory cells MC coupled to the word lines WL other than the word line WL1 in the block BLK1. Therefore, the memory data of "1" is kept in the memory cells MC coupled to the word lines WL other than the word line WL1 in the block BLK1.

Upon completion of the data writing in the memory cells MC1_1 and MC2_1 coupled to the word line WL1 in the block BLK1, next, data is written in the memory cells MC1_2 and MC2_2 coupled to the word line WL2. This operation is similarly performed on the memory cells MC coupled to each of the word lines WL3 to WL16 belonging to the block BLK1.

Next, a reading operation of the data stored in the flash memory 50 will be described. In the reading of the memory data, the memory data is read by the unit of the memory cell.

For example, when the data stored in the memory cell MC1_1 in the block BLK1 is read out, a voltage of mutually different level is applied to the source and the drain of the memory cell MC1_1, and a voltage of H level such as turning on the memory cell MC1_1 when the floating gate is charged positively is applied to the gate of the memory cell MC1_1.

In the example of FIG. 22, the potential of the bit line DL1 is set at 1 V, while the potential of the bit line SL1 is set at 0 V. The potential of the P well is set at −2 V. Further, the potential of the word line WL1 in the block BLK1 is set at 0 V.

Here, "0" is stored in the memory cell MC1_1. In short, electrons are injected into the floating gate of the memory cell MC1_1. Therefore, even when a voltage (0 V) of H level is applied to the gate of the memory cell MC1_1, the memory cell MC1_1 is not turned on. Therefore, a current does not flow between the source and the drain of the memory cell MC1_1. Based on the result, the memory data of "0" is read out.

The potential of each word line WL other than the word line WL1 in the block BLK1 is set at −2 V. According to this, the memory cells MC coupled to each of the word lines WL other than the word line WL1 in the block BLK1 are all turned off. Therefore, when reading the memory data of the memory cell MC1_1 belonging to the block BLK1, the other memory cells MC will never exert bad influence. The potentials of the bit lines DL2 and SL2 are set at 0 V.

If "1" is stored in the memory cell MC1_1, in other words, when the electrons are not injected in the floating gate of the memory cell MC1_1, the memory cell MC1_1 is turned on by applying a voltage (0 V) of H level to the gate of the memory cell MC1_1. Therefore, a current flows between the source and the drain of the memory cell MC1_1. Based on the result, the memory data of "1" is read out.

(Description of Problem of Flash Memory 50)

As mentioned above, in the flash memory 50, it is necessary to apply a high voltage about 10 V to the memory cell MC in order to rewrite the date stored in the same memory cell MC. Therefore, the word line driver 51 of driving a high voltage has to be built by using a MOS transistor (high breakdown voltage transistor) having a breakdown voltage of 10 V and less, instead of a MOS transistor (low breakdown voltage transistor) having a breakdown voltage of 5 V and less used in a large part of the peripheral circuit.

Therefore, the manufacturing process of a semiconductor device having the flash memory 50 mounted there needs the process of forming a high breakdown voltage transistor, separately from the process of forming a low breakdown voltage transistor used in a large part of the peripheral circuit. Accordingly, there is a problem such as increasing the manufacturing cost in the method of forming the word line driver 51 using a high breakdown voltage transistor. According to a decrease in the rate of the area of the flash memory 50 occupying the chip area of a semiconductor device, an increase of the manufacturing cost becomes further significant.

Hereinafter, referring to FIG. 23, the problem of the flash memory 50 will be specifically described. FIG. 23 is a view showing the voltage application state at a time of data erasing in the flash memory 50. In the example of FIG. 23, each memory cell MC in the block BUG is the target for data erasing.

Referring to FIG. 23, at a time of data erasing, each of the level shifters LS1 to LS16 shifts the access signal in the range of 1.5 V to 0 V to the range of 1.5 V to −8.5 V and outputs the above.

In the block BLK1 targeted for the data erasing, a signal of 1.5 V as the inversion output from each of the level shifters LS1 to LS16 is supplied to each of the inverters INV1 to INV16. Therefore, each of the inverters INV1 to INV16 in the block BLK1 inverts the signal of 1.5 V into a signal of −8.5 V and outputs the above to each of the corresponding word lines WL1 to WL16.

On the other hand, in each of the blocks BLK2 to BLK32 excluded from the data erasing, a signal of −8.5 V as the inversion signal from each of the level shifters LS1 to LS16 is supplied to each of the inverters INV1 to INV16. Therefore, the inverters INV1 to INV16 in each of the blocks BLK2 to BLK32 invert the signal of −8.5 V into the signal of 1.5 V and supply the above to each of the corresponding word lines WL1 to WL16.

At this point, every voltage Vds between each drain and source of the transistors MP1 to MP16 respectively provided in the inverters INV1 to INV16 in the block BLK1 shows 10 V, and every voltage Vgw between each gate and backgate of the transistors MN1 to MN16 respectively provided in the inverters INV1 to INV16 in the block BLK1 shows 10 V.

Every voltage Vgw between each gate and backgate of the transistors MP1 to MP16 respectively provided in the inverters INV1 to INV16 in each of the blocks BLK2 to BLK32 shows 10 V, and every voltage Vds between each drain and source of the transistors MN1 to MN16 respectively provided in the inverters INV1 to INV16 in each of the blocks BLK2 to BLK32 shows 10 V.

Therefore, each inverter INV provided in the word line driver 51 has to be formed by a transistor having a high breakdown voltage of 10 V and more. The manufacturing process of a semiconductor device having the flash memory 50 mounted there needs the process of forming a high breakdown voltage transistor, separately from the process of forming a low breakdown voltage transistor used in a large part of the peripheral circuit. As the result, there is a problem such as increasing the manufacturing cost.

Then, there is found a flash memory 1 according to a first embodiment, in which the word line driver is formed by only using the low breakdown voltage transistor, without using the high breakdown voltage transistor, in order to suppress an increase in the manufacturing process, hence to reduce the manufacturing cost.

First Embodiment

Figure 1:
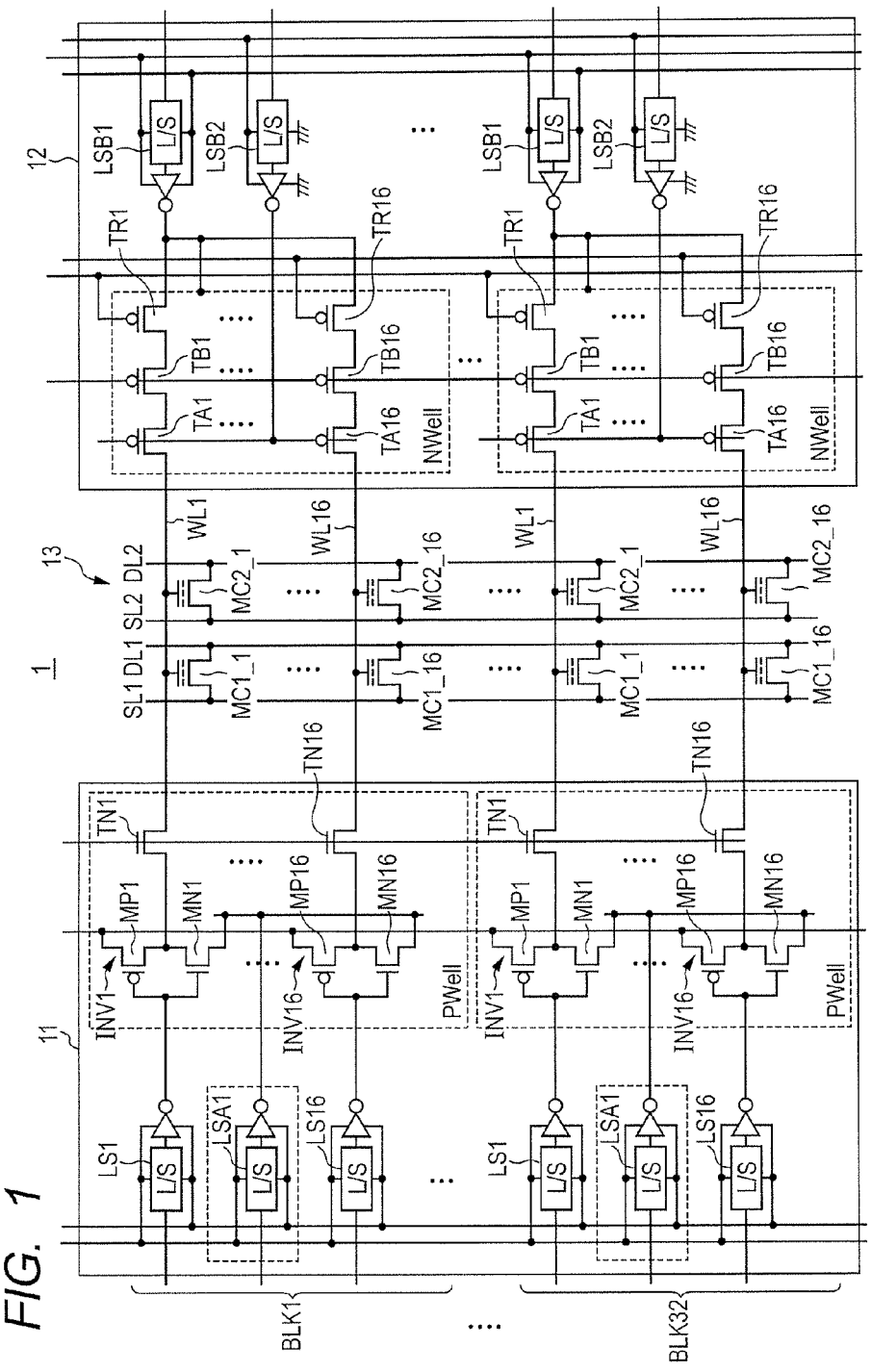
FIG. 1 is a view showing the constitutional example of a flash memory according to a first embodiment.

FIG. 1 is a view showing the constitutional example of the flash memory 1 according to the first embodiment. As shown in FIG. 1, the flash memory 1 includes a memory cell array 13 formed by a plurality of memory cells MC provided in an array shape, a plurality of word lines WL provided in each column of the memory cells MC, a plurality of bit line pairs DL and SL provided in each row of the memory cells MC, a word line driver (first word line driver) 11 that outputs a first voltage group to each of the word lines WL, and a word line driver (second word line driver) 12 that outputs a second voltage group to each of the word lines WL together with the word line driver 11.

In the example of FIG. 1, memory cells MC of 512 columns×2 rows, word lines WL in 512 columns, and bit line pairs DL and SL in two rows are provided. Here, a group of the memory cells MC in which memory data is erased together at a time of data erasing and its peripheral circuit, of a plurality of memory cells MC, are referred to as a block BLK. In this example, there are provided with groups of 32 memory cells MC (hereinafter, also referred to as memory cells MC1_1 to MC1_16, MC2_1 to MC2_16) coupled to the mutually adjacent 16 word lines WL (hereinafter, also referred to as word lines WL1 to WL16) and 32 blocks BLK as their peripheral circuits. Hereinafter, 32 blocks BLK are also referred to as blocks BLK1 to BLK32. Needless to say, the number of the memory cells MC can be set freely.

Each memory cell MC is formed by, for example, a high breakdown voltage N channel MOS transistor of 10 V and less. The corresponding word line WL is coupled to the gate of each memory cell MC, the corresponding bit line SL is coupled to the source, the corresponding bit line DL is coupled to the drain.

(Word Line Driver 11)

The word line driver 11 includes 512 level shifters LS, 512 inverters INV, 512 transistors TN provided correspondingly to 512 word lines WL, together with 32 level shifters LSA1.

In short, the word line driver 11 includes 16 level shifters LS (hereinafter, referred to as level shifters LS1 to LS16), 16 inverters INV (hereinafter, referred to as inverters INV1 to INV16), 16 N channel MOS transistors TN (hereinafter, referred to as transistors TN1 to TN16), and one level shifter LSA1, in every block of BLK1 to BLK32.

Hereinafter, the structure of the block BLK1 portion of the word line driver 11 will be described.

The level shifters LS1 to LS16 shift the maximum voltage value and the minimum voltage value of an external access signal to a value depending on the operation mode (data erasing, data writing, or data reading). The inverters INV1 to INV16 respectively invert the inversion signals of the outputs from the level shifters LS1 to LS16 in the respective former stages and output the above to the corresponding word lines WL1 to WL16.

Every inverter INV1 to INV16 is famed by a P channel MOS transistor and an N channel MOS transistor. Hereinafter, the P channel MOS transistor and the N channel MOS transistor forming the inverter INVi (i is an integer of 1 to 16) is referred to as transistor MPi and transistor MNi.

The transistors (first voltage relaxing transistors) TN1 to TN16 are respectively provided on the corresponding word lines WL1 to WL16 between the respective inverters INV1 to INV16 and the memory cell array 13 and a predetermined voltage (in this example, 1.5 V) is applied to each gate. The transistors TN1 to TN16 are voltage relaxing transistors for preventing a high voltage from being applied to the inverters INV1 to INV16.

Here, each of the inverters INV1 to INV16 and the transistors TN1 to TN16 in the block BLK1 is formed by a low breakdown voltage MOS transistor of 5 V and less and formed on the P well provided independently of the other blocks BLK2 to BLK32. It is assumed that the low breakdown voltage transistor of 5 V and less can endure the voltage Vds between the drain and source up to 5 V and less, the voltage Vgw between the gate and backgate up to 5 V and less, and the junction voltage Vj up to 8 V and less.

The level shifter LSA1 shifts the maximum voltage value and the minimum voltage value of the external access signal to the value depending on the operation mode, and then outputs the above value to the power source terminals on the lower potential side (the respective sources of the transistors MN1 to MN16) of the inverters INV1 to INV16 and the P well.

The structure of the blocks BLK2 to BLK32 of the word line driver 11 is basically the same as that of the block BUG portion of the word line driver 11; therefore, the description is omitted.

(Word Line Driver 12)

The word line driver 12 includes two level shifters LSB1 and LSB2, 16 P channel MOS transistors TR (hereinafter, referred to as transistors TR1 to TR16), 16 P channel MOS transistors TA (hereinafter, referred to as transistors TA1 to TA16), and 16 P channel MOS transistors TB (hereinafter, referred to as transistors TB1 to TB16), in every block of BLK1 to BLK32.

Hereinafter, the structure of the block BLK1 portion of the word line driver 12 will be described.

The level shifter LSB1 shifts the maximum voltage value and the minimum voltage value of the external access signal to the value depending on the operation mode and outputs the above.

The transistors TR1 to TR16 are respectively provided on the corresponding word lines WL1 to WL16 between the memory cell array 13 and the level shifters LSB1 and on/off controlled according to the external access signal. In short, each of the transistors TR1 to TR16 has a function as a so-called select circuit and outputs the inversion signal of the output from the level shifter LSB1 to the word line WL coupled to the transistor TR in the on state.

The level shifter LSB2 shifts the maximum voltage value and the minimum voltage value of the external access signal to the value depending on the operation mode and outputs the above. The transistors TA1 to TA16 are respectively provided on the corresponding word lines WL1 to WL16 between the respective transistors TR1 to TR16 and the memory cell array 13, and the inversion signal of the output from the level shifter LSB2 is applied to each gate. The transistors TB1 to TB16 are respectively provided between the transistors TR1 to TR16 and the transistors TA1 to TA16, and a predetermined voltage depending on the operation mode is applied to each gate. The transistors TA1 to TA16 and TB1 to TB16 are voltage relaxing transistors for preventing a high voltage from being applied to the transistors TR1 to TR16.

Here, the transistors TR1 to TR16, TA1 to TA16, and TB1 to TB16 in the block BLK1 are all formed by low breakdown voltage MOS transistors of 5 V and less, and at the same time, formed on the N well provided independently of the other blocks BLK2 to BLK32. The inversion signal of the output from the level shifter LSB1 is applied to the N well.

The structure of the blocks BLK2 to BLK32 of the word line driver 12 is basically the same as the structure of the block BLK1 portion of the word line driver 12; therefore, the description is omitted.

The word line driver 11 and the word line driver 12 are arranged oppositely with the memory cell array 13 interposed therebetween. According to this, compared with the case of locally arranging the word line drivers 11 and 12, it is possible to minimize an increase in the circuit size because the wiring complication can be relaxed.

(Operation of Flash Memory 1)

Figure 2:
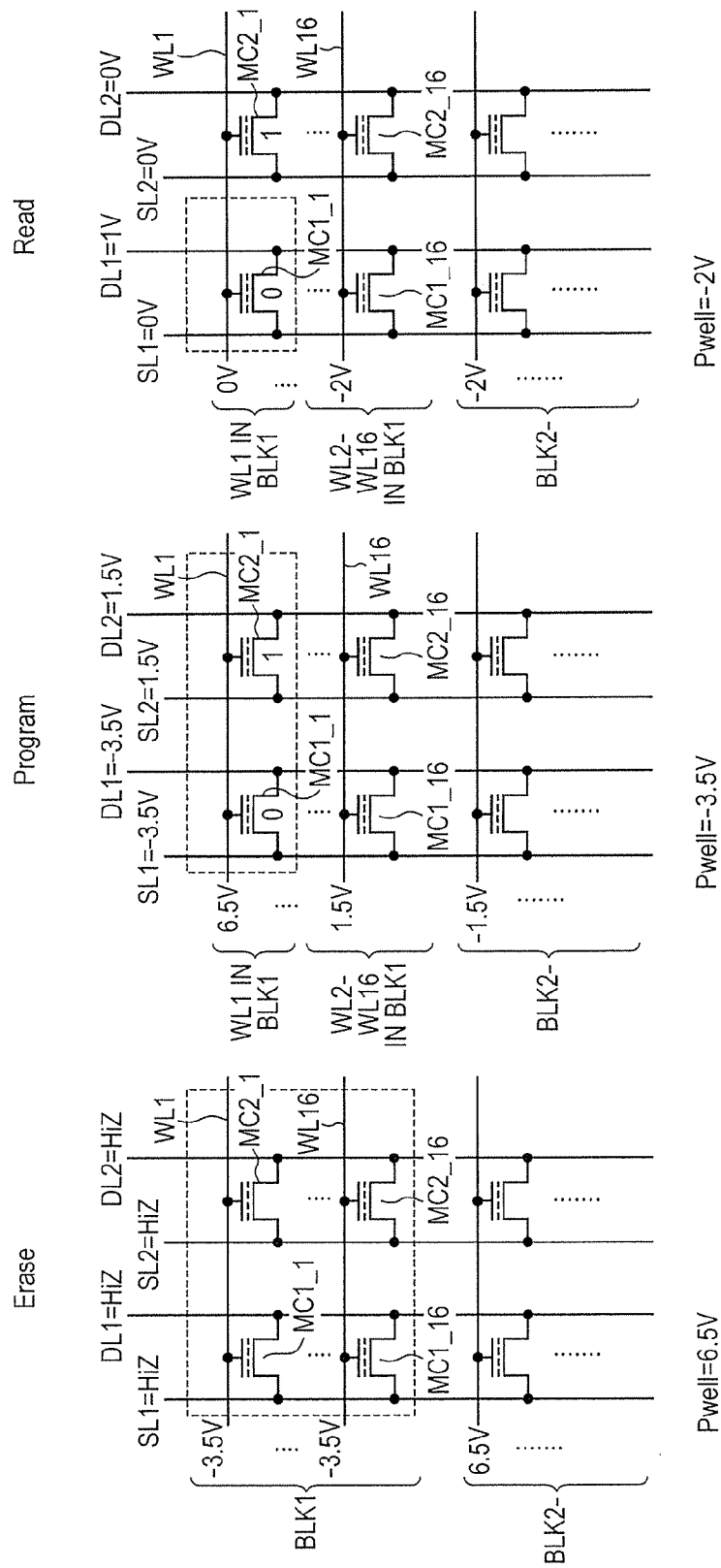
FIG. 2 is a view showing the voltage application state in each operation mode of the flash memory shown in FIG. 1.

Continuously, referring to FIG. 2, the operation of the flash memory 1 will be described. FIG. 2 is a view showing the voltage application state in each operation mode of the flash memory 1.

At first, a rewriting operation of the data stored in the flash memory 1 will be described. In the rewriting of the memory data, after the memory data is erased by the unit of block, the memory data is written by the unit of the word line.

For example, when the data stored in each memory cell MC in the block BLK1 is rewritten, at first the data stored in each memory cell MC in the block BLK1 is erased together at once. Specifically, a higher voltage is applied to each source than to each gate of the memory cells MC1_1 to MC1_16, and MC2_1 to MC2_16 belonging to the block BLK1.

In the example of FIG. 2, all the bit line pairs SL1, DL1 and SL2, DL2 are set at high impedance (HiZ), the potential of the P well where to form the memory cell array 13 is set at 6.5 V, the potentials of the word lines WL1 to WL16 in the block BLK1 targeted for data erasing are set at −3.5 V, and the potentials of the word lines WL1 to WL16 in each of the blocks BLK2 to BLK32 excluded from the data erasing are set at 6.5 V. Since the bit line pairs SL1, DL1 and SL2, DL2 have high impedance (HiZ), a lower voltage than the potential 6.5 V of the P well by the forward junction voltage is applied there. According to this, a higher voltage by 10 V is applied to each source than to each gate of the memory cells MC1_1 to MC1_16 and MC2_1 to MC2_16 belonging to the block BLK1.

According to this, in the memory cell with "0" stored, of the memory cells MC1_1 to MC1_16 and MC2_1 to MC2_16 belonging to the block BLK1, electrons accumulated in the floating gate are drawn to the side of the source and the memory data is rewritten from "0" to "1". In short, all the memory data of the memory cells MC1_1 to MC1_16 and MC2_1 to MC2_16 belonging to the block BLK1 is rewritten to "1" (in short, erased together at once).

Then, the memory data is written in the memory cell by the unit of the word line.

Specifically, the data is written in the memory cells MC1_1 and MC2_1 coupled to the word line WL1 in the block BLK1. For example, when "0" is written in the memory cell MC1_1 and "1" is written in the memory cell MC2_1, a quite higher voltage is applied to the gate than to the source of the memory cell MC1_1. On the other hand, a higher voltage is not applied to the gate than to the source of the memory cell MC2_1.

In the example of FIG. 2, the potentials of the bit line pair SL1 and DL1 are set at −3.5 V, the potential of the P well forming the memory cell array 13 is set at −3.5 V, the potentials of the bit line pair SL2 and DL2 are set at 1.5 V, and the potential of the word line WL1 in the block BLK1 is set at 6.5 V. According to this, a higher voltage by 10 V is applied to the gate than to the source of the memory cell MC1_1 belonging to the block BLK1. On the other hand, a higher voltage just by 5 V only is applied to the gate than to the source of the memory cell MC2_1 belonging to the block BLK1.

According to this, in the memory cell MC1_1 belonging to the block BLK1, since the electrons drawn from the source to the gate are taken in the floating gate, the data of "0" is written. On the other hand, in the memory cell MC2_1 belonging to the block BLK1, since the electrons drawn from the source to the gate are not taken in the floating gate, the memory data of "1" is kept.

In the example of FIG. 2, each potential of the word lines WL2 to WL16 belonging to the block BLK1 is set at 1.5 V and each potential of the word lines WL1 to WL16 belonging to each of the blocks BLK2 to BLK32 is set at −1.5 V. According to this, a higher voltage just by only 5 V or 2 V is applied to each gate than to each source of the memory cells MC coupled to the word lines WL other than the word line WL1 in the block BLK1. As the result, the memory data of "1" is kept in the memory cells MC coupled to the word lines WL other than the word line WL1 in the block BLK1.

Upon completion of the data writing in the memory cells MC1_1 and MC2_1 coupled to the word line WL1 in the block BLK1, next, data is written in the memory cells MC1_2 and MC2_2 coupled to the word line WL2. This operation is similarly performed on the memory cells MC coupled to the respective word lines WL3 to WL16 belonging to the block BLK1.

Next, a reading operation of the data stored in the flash memory 1 will be described. In the reading of the memory data, the memory data is read by the unit of the memory cell.

For example, when the data stored in the memory cell MC1_1 in the block BLK1 is read out, a voltage of mutually different level is applied to the source and the drain of the memory cell MC1_1, and a voltage of H level such as turning on the memory cell MC1_1 when the floating gate is charged positively is applied to the gate of the memory cell MC1_1.

In the example of FIG. 2, the potential of the bit line DL1 is set at 1 V, while the potential of the bit line SL1 is set at 0 V. The potential of the P well is set at −2 V. Further, the potential of the word line WL1 in the block BLK1 is set at 0 V.

Here, "0" is stored in the memory cell MC1_1. In short, electrons are injected into the floating gate of the memory cell MC1_1. Therefore, even when a voltage (0 V) of H level is applied to the gate of the memory cell MC1_1, the memory cell MC1_1 is not turned on. Therefore, a current does not flow between the source and the drain of the memory cell MC1_1. Based on the result, the memory data of "0" is read out.

The potential of each word line WL other than the word line WL1 in the block BLK1 is set at −2 V. According to this, the memory cells MC coupled to each of the word lines WL other than the word line WL1 in the block BLK1 are all turned off. Therefore, when reading the memory data of the memory cell MC1_1 belonging to the block BLK1, the other memory cells MC will never exert bad influence. The potentials of the bit lines DL2 and SL2 are set at 0 V.

If "1" is stored in the memory cell MC1_1, in other words, when the electrons are not injected in the floating gate of the memory cell MC1_1, the memory cell MC1_1 is turned on by applying a voltage (0 V) of H level to the gate of the memory cell MC1_1. Therefore, a current flows between the source and the drain of the memory cell MC1_1. Based on the result, the memory data of "1" is read out.

(Description of Effect of Flash Memory 1)

As mentioned above, in the flash memory 1, in order to rewrite the data stored in a memory cell MC, it is necessary to apply a high voltage about 10 V to the memory cell MC. However, the word line drivers 11 and 12 of driving a high voltage can be formed by low breakdown voltage transistors having the same breakdown voltage of 5 V and less as the transistor used in a large part of the peripheral circuit, without using a high breakdown voltage transistor. Hereinafter, referring to FIGS. 3, 4, and 5, the reason will be described.

Figure 3:
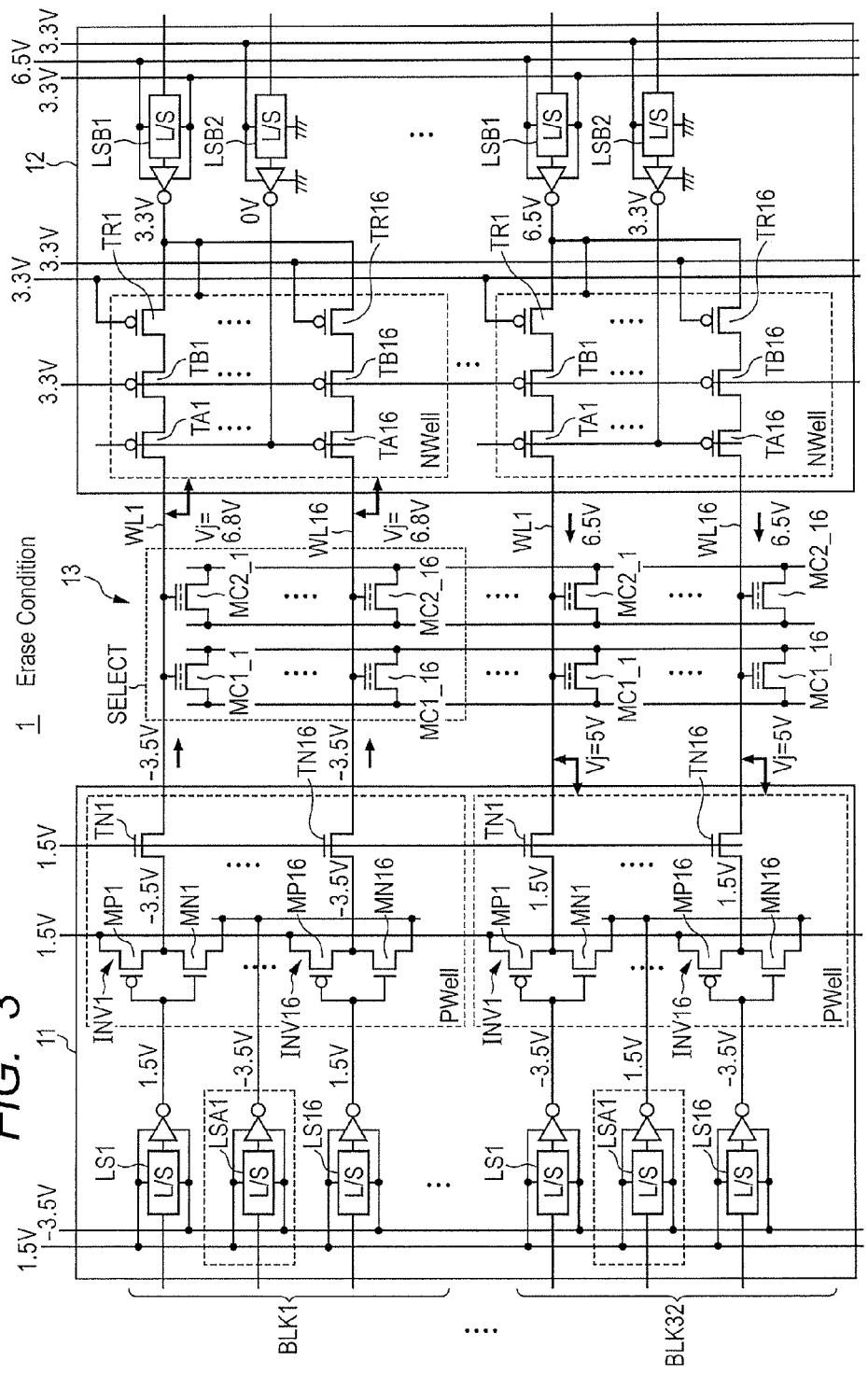
FIG. 3 is a view showing the voltage application state at a time of data erasing (Erase) in the flash memory shown in FIG. 1.
Figure 4:
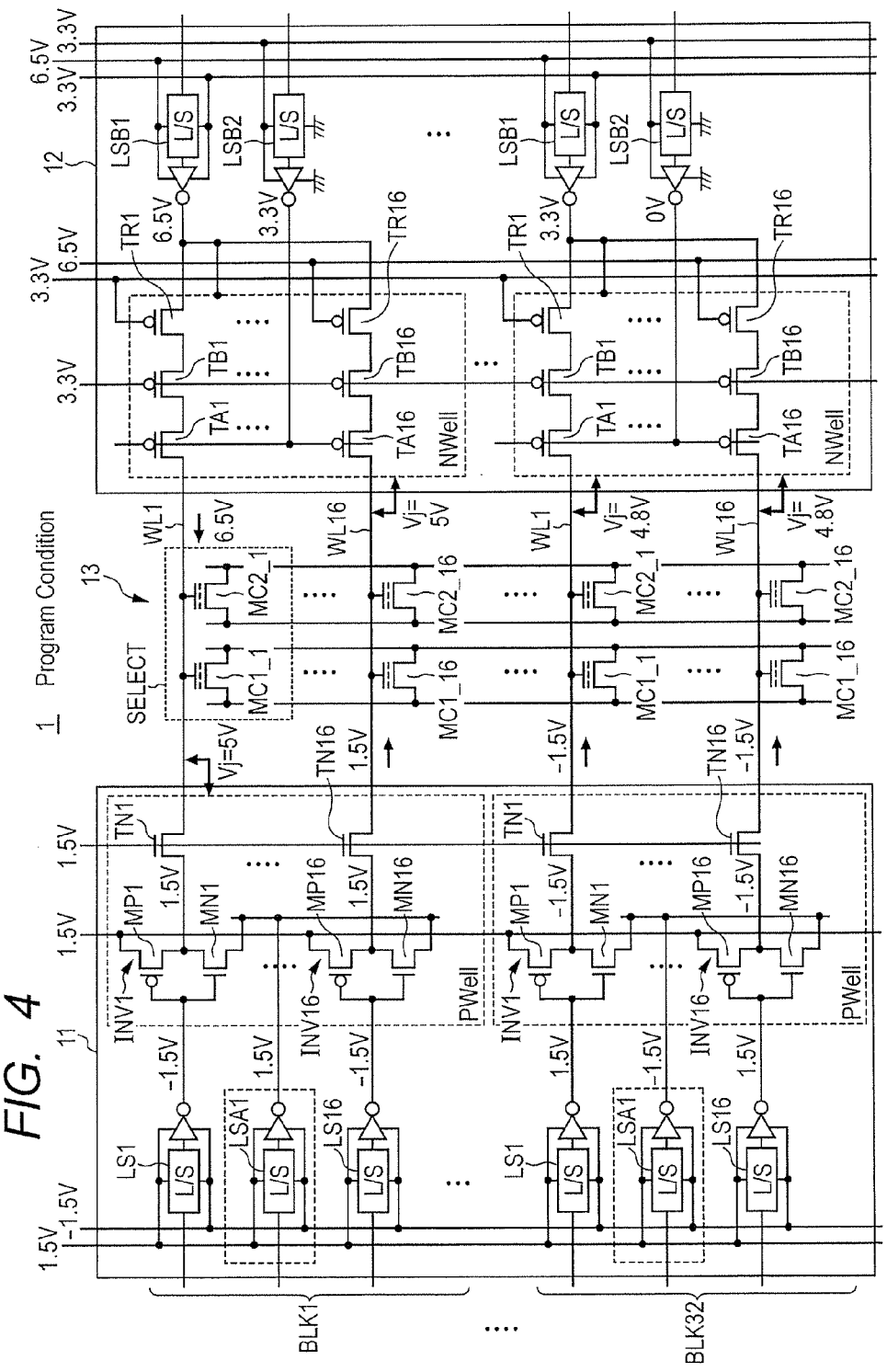
FIG. 4 is a view showing the voltage application state at a time of data writing (Program) in the flash memory shown in FIG. 1.
Figure 5:
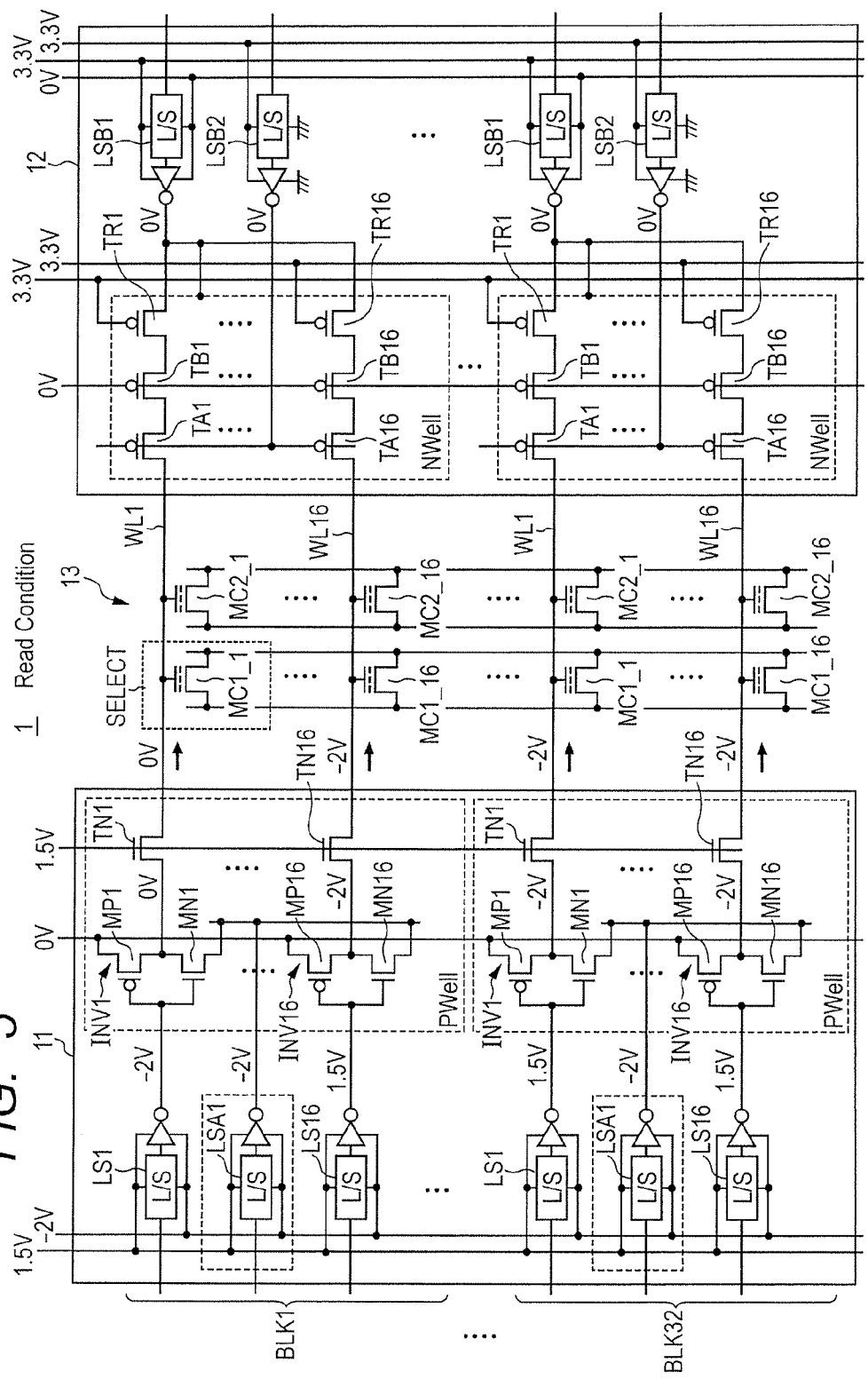
FIG. 5 is a view showing the voltage application state at a time of data reading (Read) in the flash memory shown in FIG. 1.

FIGS. 3 to 5 are views respectively showing the voltage application state at a time of data erasing, data writing, and data reading of the flash memory 1. Hereinafter, a description will be made in the case of erasing the memory data of each memory cell MC in the block BLK1 at a time of the data erasing, writing data in each memory cell MC coupled to the word line WL1 in the block BLK1 at a time of the data writing, and reading the memory data of the memory cell MC1_1 in the block BLK1 at a time of the data reading.

Referring to FIG. 3, at a time of the data erasing, each of the level shifters LS1 to LS16 and LSA1 of the word line driver 11 shifts the access signal in the range of 1.5 V to 0 V to the range of 1.5 V to −3.5 V and outputs the above. Each level shifter LSB1 of the word line driver 12 shifts the access signal in the range of 1.5 V to 0 V to the range of 6.5 V to 3.3 V and outputs the above. Each level shifter LSB2 of the word line driver 12 shifts the access signal in the range of 1.5 V to 0 V to the range of 3.3 V to 0 V and outputs the above.

In the block BLK1 portion of the word line driver 11, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the signal of −3.5 V as the inversion output from the level shifter LSA1 is supplied to the power terminal on the side of low potential of the inverters INV1 to INV16 and the P well. Therefore, the inverters INV1 to INV16 invert the signals of 1.5 V into the signals of −3.5 V and output the above. The signals of −3.5 V as the outputs from the inverters INV1 to INV16 are respectively supplied to the corresponding word lines WL1 to WL16.

In each portion of the blocks BLK2 to BLK32 of the word line driver 11, the signals of −3.5 V as the inversion outputs from the level shifters LS1 to LS16 are respectively supplied to the inverters INV1 to INV16. Further, the voltages of 1.5 V are supplied to the power terminal on the side of high potential of the inverters INV1 to INV16, and the signal of 1.5 V as the inversion output from the level shifter LSA1 is supplied to the power terminal on the side of lower potential of the inverters INV1 to INV16 and the P well. Therefore, the inverters INV1 to INV16 invert the signals of −3.5 V into the signals of 1.5 V and output the above. Here, the voltage of 1.5 V is supplied to each gate and source of the transistors TN1 to TN16, hence to turn off the above transistors.

In the block BLK1 portion of the word line driver 12, the signal of 3.3 V as the inversion output from the level shifter LSB1 is supplied to each source of the transistors TR1 to TR16 and the N well. Here, the voltage of 3.3 V is supplied to each gate and source of the transistors TR1 to TR16, hence to turn off the above transistors. The signal of 0 V as the inversion output from the level shifter LSB2 is supplied to each gate of the transistors TA1 to TA16. The voltage of 3.3 V is supplied to each gate of the transistors TB1 to TB16.

In each portion of the blocks BLK2 to BLK32 of the word line driver 12, the signal of 6.5 V as the inversion output from the level shifter LSB1 is supplied to each source of the transistors TR1 to TR16 and the N well. Further, the signal of 3.3 V as the inversion output from the level shifter LSB2 is supplied to each gate of the transistors TA1 to TA16. The voltage of 3.3 V is supplied to each gate of the transistors TB1 to TB16. Therefore, the transistors TR1 to TR16, TB1 to TB16, and TA1 to TA16 are all turned on. The signal of 6.5 V as the inversion output from the level shifter LSB1 is supplied to the corresponding word lines WL1 to WL16.

At this time, for example, every junction voltage Vj of the transistors TA1 to TA16 in the block BLK1 shows 6.8 V. Further, every junction voltage Vj of the transistors TN1 to TN16 in each of the blocks BLK2 to BLK32 shows 5 V. In every transistor forming the word line drivers 11 and 12 other than the above, the junction voltage Vj is 8 V and less, the voltage Vds between each drain and source is 5 V and less, and the voltage Vgw between each gate and backgate is 5 V and less.

Referring to FIG. 4, at a time of the data writing, each of the level shifters LS1 to LS16 and LSA1 of the word line driver 11 shifts the access signal in the range of 1.5 V to 0 V to the range of 1.5 V to −1.5 V and outputs the above. Each level shifter LSB1 of the word line driver 12 shifts the access signal in the range of 1.5 V to 0 V to the range of 6.5 V to 3.3 V and outputs the above. Each level shifter LSB2 of the word line driver 12 shifts the access signal in the range of 1.5 V to 0 V to the range of 3.3 V to 0 V and outputs the above.

In the block BLK1 portion of the word line driver 11, the signals of −1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the signal of 1.5 V as the inversion output from the level shifter LSA1 is supplied to the power terminal on the side of low potential of the inverters INV1 to INV16 and the P well. Therefore, the inverters INV1 to INV16 invert the signals of −1.5 V into the signals of 1.5 V and output the above. Here, the transistor TN1 is turned off because of receiving the voltage of 1.5 V at the gate and source thereof. While, the signals of 1.5 V as the outputs from the inverters INV2 to INV16 are respectively supplied to the corresponding word lines WL2 to WL16 because the output of the word line driver 12 coupled to the word lines WL2 to WL16 is a high impedance (HiZ). Actually, the voltages applied to the word lines WL2 to WL16 show the lower values than 1.5 V by the respective threshold voltages of the transistors TN2 to TN16; however, for the sake of simplification on the drawings, they are shown as 1.5 V.

In each portion of the blocks BLK2 to BLK32 of the word line driver 11, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the signal of −1.5 V as the inversion output from the level shifter LSA1 is supplied to the power terminal on the side of lower potential of the inverters INV1 to INV16 and the P well. Therefore, the inverters INV1 to INV16 invert the signals of 1.5 V into the signals of −1.5 V and output the above. The signals of −1.5 V as the outputs from the inverters INV1 to INV16 are respectively supplied to the corresponding word lines WL1 to WL16.

In the block BLK1 portion of the word line driver 12, the signal of 6.5 V as the inversion output from the level shifter LSB1 is supplied to each source of the transistors TR1 to TR16 and the N well. Here, the transistor TR1 is turned on because the voltage supplied to the gate and source is a threshold voltage and more. While, the transistors TR2 to TR16 are turned off because of receiving the voltage of 6.5 V at each gate and source thereof. The signal of 3.3 V as the inversion output from the level shifter LSB2 is supplied to each gate of the transistors TA1 to TA16. The voltage of 3.3 V is supplied to each gate of the transistors TB1 to TB16.

Therefore, the signal of 6.5 V as the inversion output from the level shifter LSB1 is supplied only to the corresponding word line WL1.

In each portion of the blocks BLK2 to BLK32 of the word line driver 12, the signal of 3.3 V as the inversion output from the level shifter LSB1 is supplied to each source of the transistors TR1 to TR16 and the N well. Here, the transistors TR1 to TR16 are turned off because the voltage supplied to each gate and source is less than the threshold voltage. The signal of 0 V as the inversion output from the level shifter LSB2 is supplied to each gate of the transistors TA1 to TA16. The voltage of 3.3 V is supplied to each gate of the transistors TB1 to TB16.

At this time, for example, every junction voltage Vj of the transistors TN1 and TA2 to TA16 in the block BLK1 shows 5 V. Further, every junction voltage Vj of the transistors TA1 to TA16 in each of the blocks BLK2 to BLK32 shows 4.8 V. In every transistor forming the word line drivers 11 and 12 other than the above, the junction voltage Vj is 8 V and less, the voltage Vds between each drain and source is 5 V and less, and the voltage Vgw between each gate and backgate is 5 V and less.

Referring to FIG. 5, at a time of the data reading, each of the level shifters LS1 to LS16 and LSA1 of the word line driver 11 shifts the access signal in the range of 1.5 V to 0 V to the range of 1.5 V to −2 V and outputs the above. Each of the level shifters LSB1 and LSB2 of the word line driver 12 shifts the access signal in the range of 1.5 V to 0 V to the range of 3.3 V to 0 V and outputs the above.

In the block BLK1 portion of the word line driver 11, the signal of −2 V as the inversion output from the level shifter LS1 is supplied to the inverter INV1 and the signals of 1.5 V as the inversion outputs from the level shifters LS2 to LS16 are respectively supplied to the inverters INV2 to INV16. Further, the voltage of 0 V is supplied to the power terminal on the side of high potential of the inverters INV1 to INV16, and the signal of −2 V as the inversion output from the level shifter LSA1 is supplied to the power terminal on the side of low potential of the inverters INV1 to INV16 and the P well. Therefore, the inverter INV1 inverts the signals of −2 V into the signals of 0 V and outputs the above, and the inverters INV2 to INV16 invert the signal of 1.5 V into the signal of −2 V and output the above. The signal of 0 V as the output of the inverter INV1 is supplied to the corresponding word line WL1 and the signals of −2 V as the outputs of the inverters INV2 to INV16 are respectively supplied to the corresponding word lines WL2 to WL16.

In each portion of the blocks BLK2 to BLK32 of the word line driver 11, the signals of 1.5 V as the inversion outputs from the level shifters LS1 to LS16 are respectively supplied to the inverters INV1 to INV16. Further, the voltage of 0 V is supplied to the power terminal on the side of high potential of the inverters INV1 to INV16, and the signal of −2 V as the inversion output from the level shifter LSA1 is supplied to the power terminal on the side of lower potential of the inverters INV1 to INV16 and the P well. Therefore, the inverters INV1 to INV16 invert the signals of 1.5 V into the signals of −2 V and output the above. The signals of −2 V as the outputs from the inverters INV1 to INV16 are respectively supplied to the corresponding word lines WL1 to WL16.

In the block BLK1 portion of the word line driver 12, the signal of 0 V as the inversion output from the level shifter LSB1 is supplied to each source of the transistors TR1 to TR16 and the N well. Here, the transistors TR1 to TR16 are turned on because the voltage supplied to each gate and source is less than the threshold voltage. The signal of 0 V as the inversion output from the level shifter LSB2 is supplied to each gate of the transistors TA1 to TA16. The voltage of 0 V is supplied to each gate of the transistors TB1 to TB16.

In each portion of the blocks BLK2 to BLK32 of the word line driver 12, the signal of 0 V as the inversion output from the level shifter LSB1 is supplied to each source of the transistors TR1 to TR16 and the N well. Here, the transistors TR1 to TR16 are turned off because the voltage supplied to each gate and source is less than the threshold voltage. The signal of 0 V as the inversion output from the level shifter LSB2 is supplied to each gate of the transistors TA1 to TA16. The voltage of 0 V is supplied to each gate of the transistors TB1 to TB16.

As mentioned above, at a time of the data reading, 512 word lines WL are driven by the high speed operable word line driver 11. Also, in all the transistors forming the word line drivers 11 and 12, the junction voltage Vj is 8 V and less, the voltage Vds between each drain and source is 5 V and less, and the voltage Vgw between each gate and backgate is 5 V and less.

As mentioned above, in the flash memory 1 according to the embodiment, a high voltage to be applied to the memory cell MC at a time of the data writing is created by using the two word line drivers 11 and 12. According to this, the flash memory 1 according to the embodiment can form the word line drivers 11 and 12 only by using the low breakdown voltage transistor, without using the high breakdown voltage transistor, hence to suppress an increase in the manufacturing process and as the result, to reduce the manufacturing cost.

The flash memory 1 according to the embodiment can realize a higher speed operation by forming the word line drivers 11 and 12 using the low breakdown voltage transistor than in the case of forming the word line drivers using the high breakdown voltage transistor.

Further, the flash memory 1 according to the embodiment uses the word line drivers 11 and 12 depending on the operation mode; for example, at a time of the data reading, the word line WL is driven only by using the word line driver 11. Therefore, the flash memory 1 can control an increase in the circuit size because the layout can be efficiently performed. Specifically, for example, because the word line driver 12 does not need a high speed operation, it can be formed by a transistor of a smaller size.

The structure of the word line drivers 11 and 12 is not restricted to the above structure but without departing from the spirit of the invention, it can be properly changed to other structure having the same function. Hereinafter, the modified example of the word line driver 12 will be briefly described.

(Modified Example of Word Line Driver 12)

Figure 6:
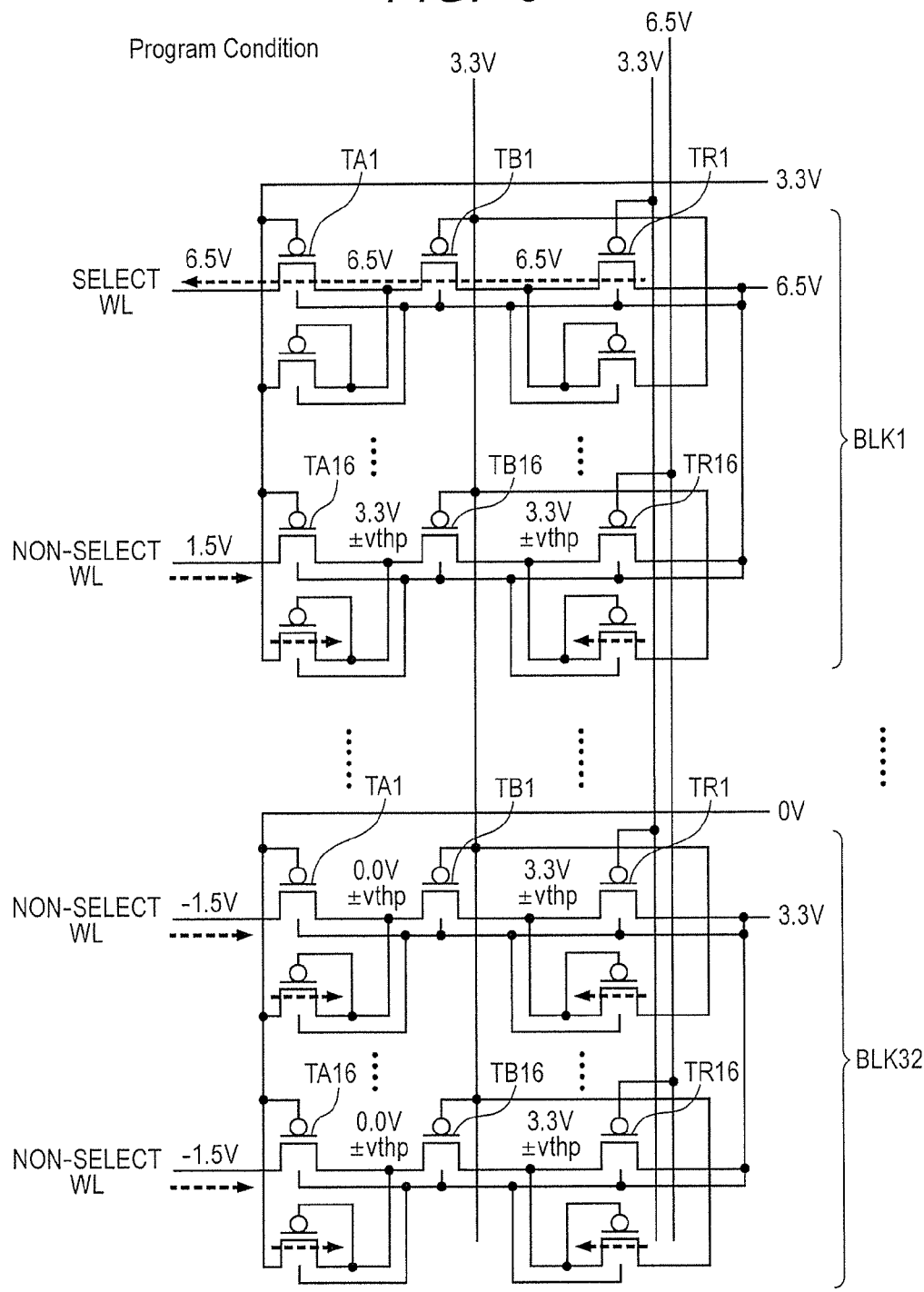
FIG. 6 is a view showing a concrete constitutional example of a part of a word line driver at one side in the flash memory shown in FIG. 1.

FIG. 6 shows a concrete constitutional example of a part of the word line driver 12. Referring to FIG. 6, the word line driver 12 is provided with P channel MOS transistors for floating protection between the respective transistors TR1 to TR16 and the respective transistors TB1 to TB16 and between the respective transistors TB1 to TB16 and the respective transistors TA1 to TA16, in each of the blocks BLK1 to BLK32.

Figure 7:
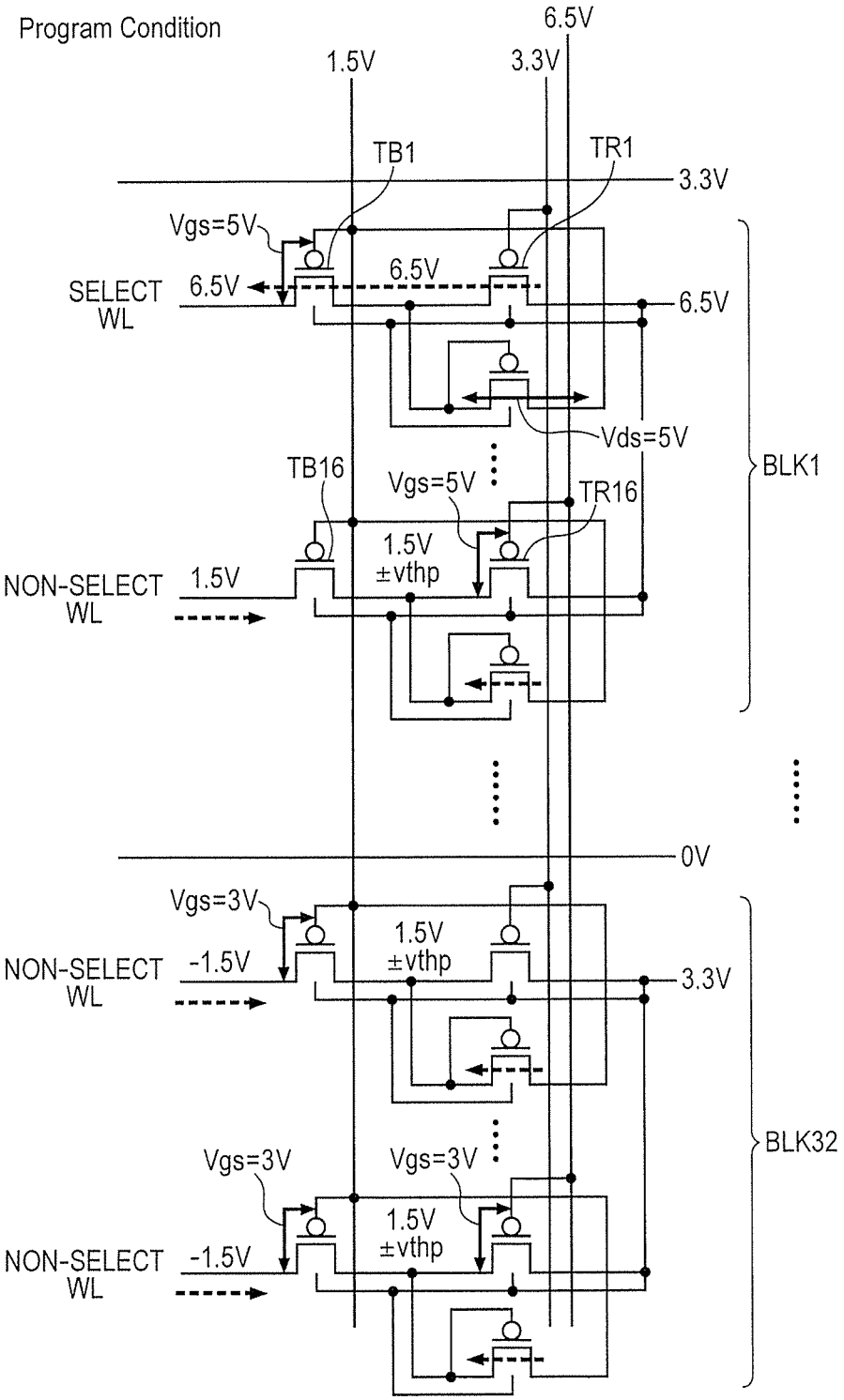
FIG. 7 is a view showing a modified example of a part of the word line driver at one side in the flash memory shown in FIG. 1.

Next, FIG. 7 shows the modified example of a part of the word line driver 12 as the word line driver 12a. Referring to FIG. 7, the word line driver 12a does not include the transistors TA1 to TA16 in each of the blocks BLK1 to BLK32, compared with the word line driver 12. At a time of the data writing, the voltage of 1.5 V instead of the voltage of 3.3 V is supplied to each gate of the transistors TB1 to TB16 provided in each of the blocks BLK1 to BLK32.

According to this, the maximum of the voltage Vds between the drain and source of each transistor forming the word line driver 12 rises from 3.5 V to 5 V at a time of the data writing (and the data erasing); if this is permittable, the word line driver 12 can be properly changed to the structure of the word line driver 12a. This is true to the other embodiments.

Second Embodiment

Figure 8:
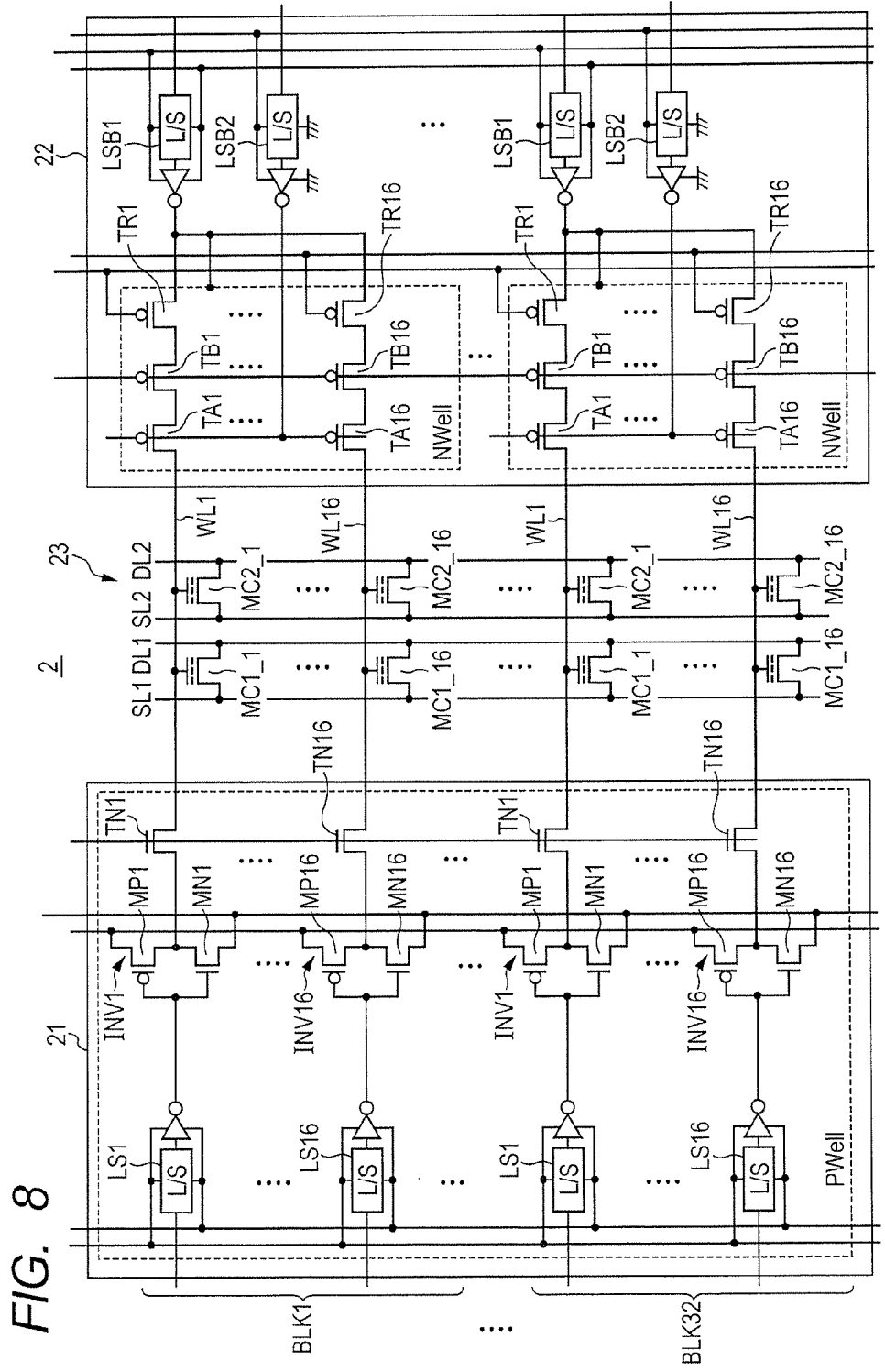
FIG. 8 is a view showing the constitutional example of a flash memory according to a second embodiment.

FIG. 8 is a view showing the constitutional example of a flash memory 2 according to a second embodiment. The flash memory 2 includes a memory cell array 23, word line drivers 21 and 22, a plurality of word lines WL, and a plurality of bit line pairs DL and SL. The memory cell array 23 and the word line drivers 21 and 22 respectively correspond to the memory cell array 13 and the word line drivers 11 and 12.

In the word line driver 21, the level shifter LSA1 is not provided in each of the blocks BLK1 to BLK32, compared with the word line driver 11. Further, a plurality of inverters INV1 to INV16 and a plurality of transistors TN1 to TN16 provided in each of the blocks BLK1 to BLK32 are formed on the common P well. Further, a common voltage is supplied to the power terminal on the side of low potential of the inverters INV1 to INV16 provided in each of the blocks BLK1 to BLK32. The other structure of the word line driver 22 and the flash memory 2 having the above is the same as the word line driver 11 and the flash memory 1 having the above; therefore, the description is omitted.

(Voltage Application State in Each Operation Mode of Flash Memory 2)

Figure 9:
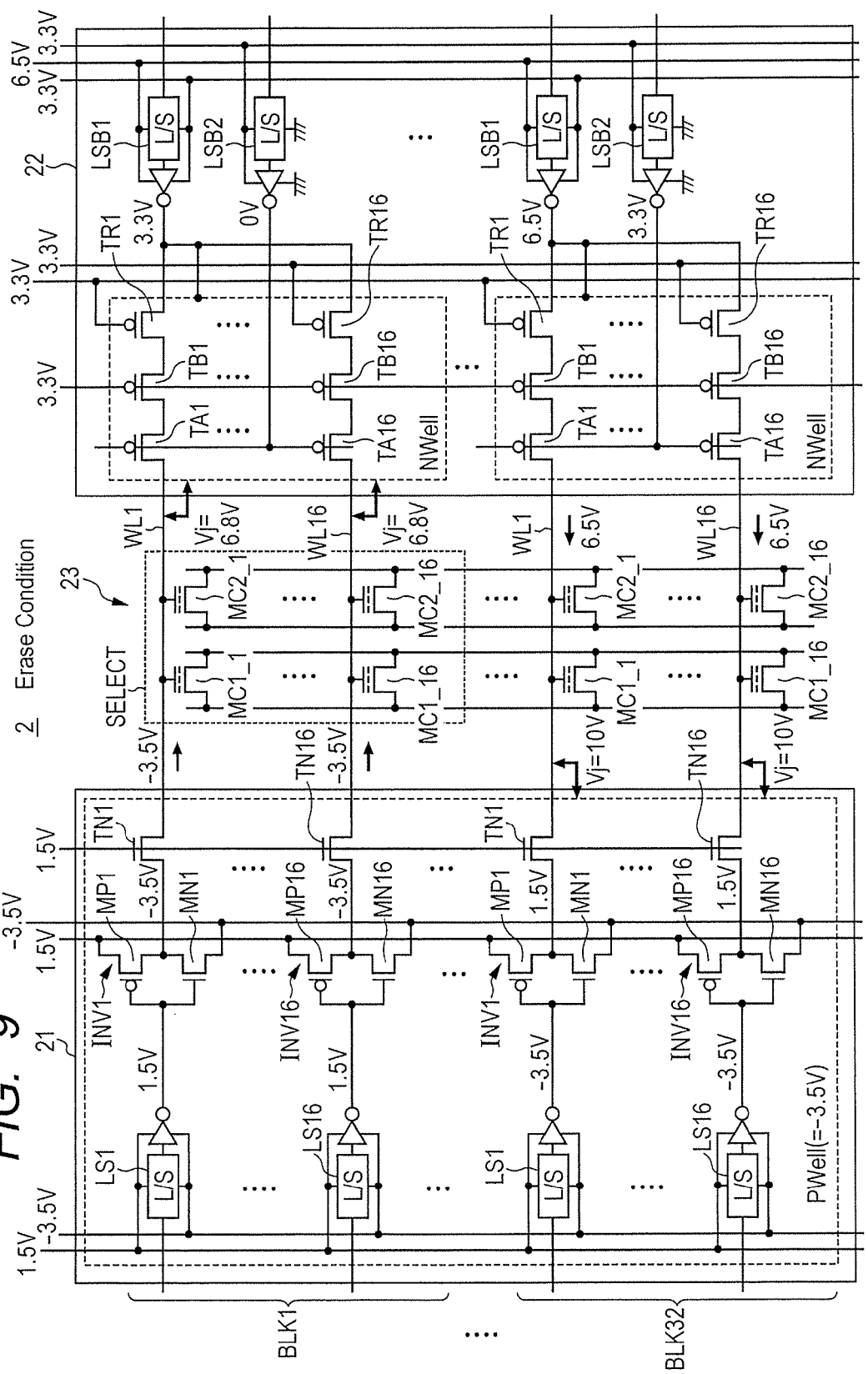
FIG. 9 is a view showing the voltage application state at a time of data erasing in the flash memory shown in FIG. 8.
Figure 10:
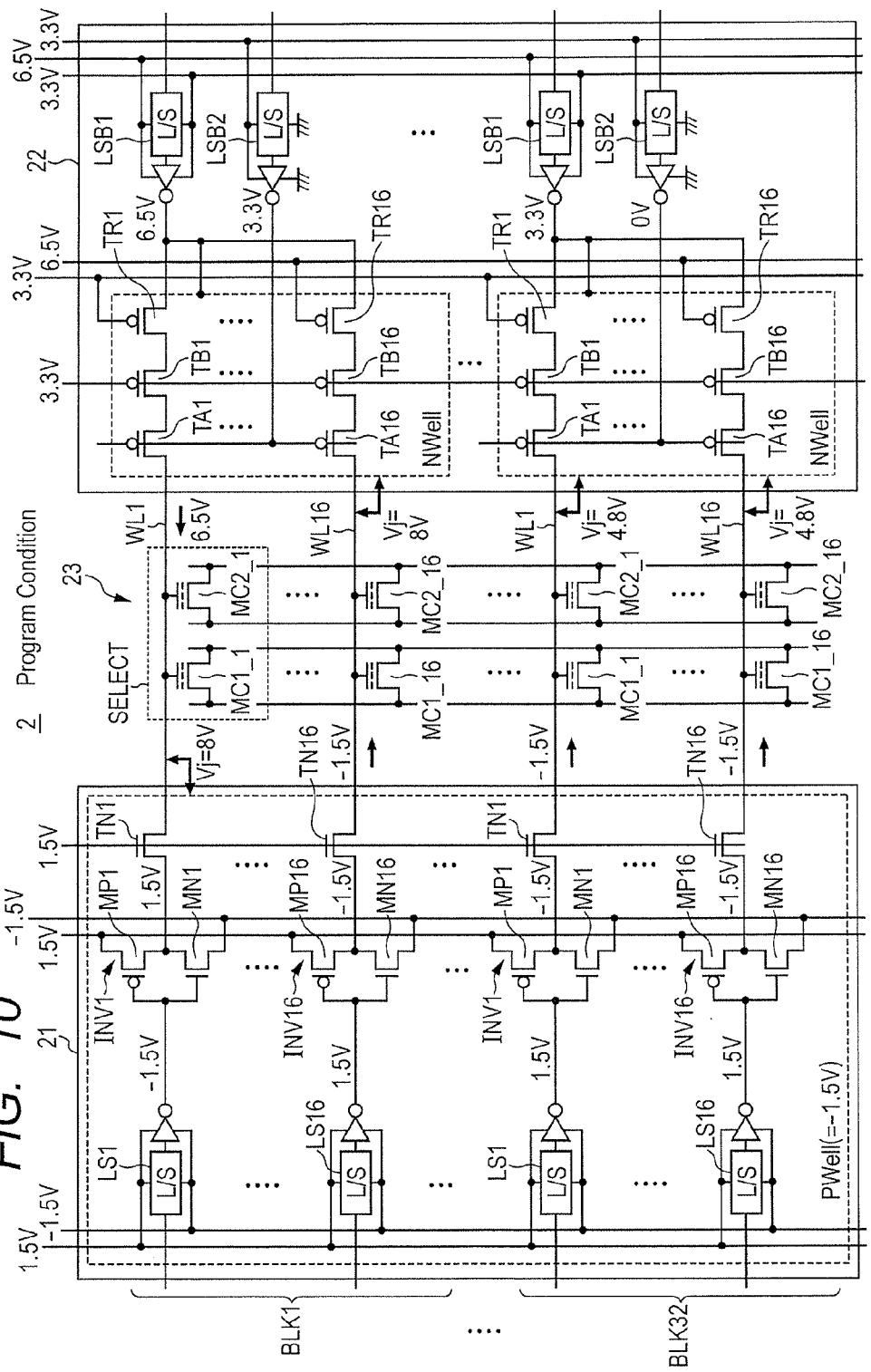
FIG. 10 is a view showing the voltage application state at a time of data writing in the flash memory shown in FIG. 8.
Figure 11:
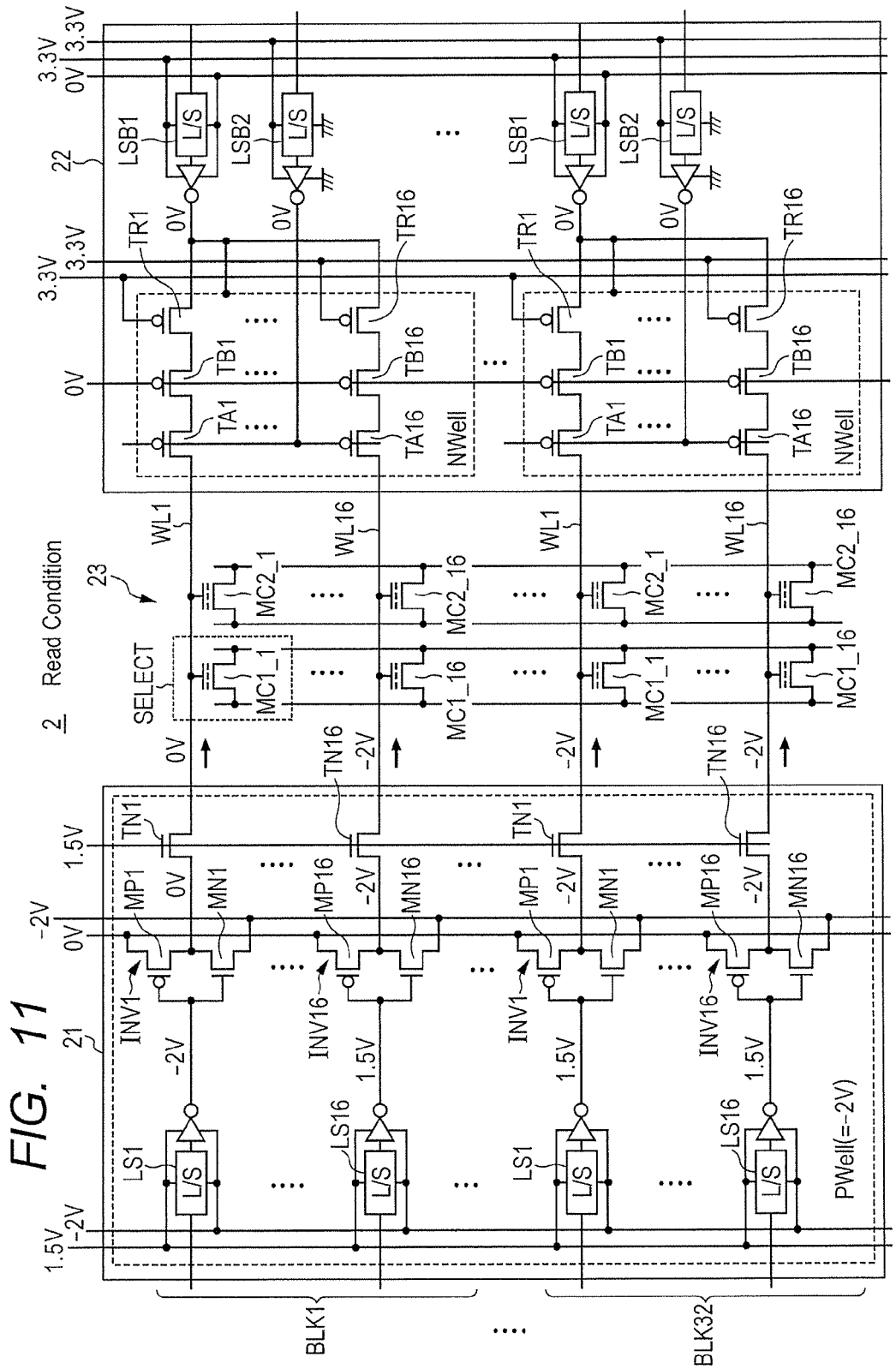
FIG. 11 is a view showing the voltage application state at a time of data reading in the flash memory shown in FIG. 8.

FIGS. 9 to 11 show the voltage application state at a time of data erasing, data writing, and data reading of the flash memory 2. Hereinafter, a description will be made in the case of erasing the memory data of each memory cell MC in the block BLK1 at a time of data erasing, writing data in each memory cell MC coupled to the word line WL1 in the block BLK1 at a time of data writing, and reading the memory data of the memory cell MC1_1 in the block BLK1 at a time of data reading.

Referring to FIG. 9, at a time of the data erasing, each of the level shifters LS1 to LS16 of the word line driver 21 shifts the access signal in the range of 1.5 V to 0 V to the range of 1.5 V to −3.5 V and outputs the above. Each of the level shifters LSB1 of the word line driver 22 shifts the access signal in the range of 1.5 V to 0 V to the range of 6.5 V to 3.3 V and outputs the above. Each level shifter LSB2 of the word line driver 22 shifts the access signal in the range of 1.5 V to 0 V to the range of 3.3 V to 0 V.

In the block BLK1 portion of the word line driver 21, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the voltage of −3.5 V is supplied to the power terminal on the side of low potential of the inverters INV1 to INV16 and the P well. Therefore, the inverters INV1 to INV16 invert the signals of 1.5 V into the signals of −3.5 V and output the above. The signals of −3.5 V as the outputs from the inverters INV1 to INV16 are respectively supplied to the corresponding word lines WL1 to WL16.

In each portion of the blocks BLK2 to BLK32 of the word line driver 21, the signals of −3.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the voltage of −3.5 V is supplied to the power terminal on the side of lower potential of the inverters INV1 to INV16 and the P well. Therefore, the inverters INV1 to INV16 invert the signals of −3.5 V into the signals of 1.5 V and output the above. The transistors TN1 to TN16 are turned off because of receiving the voltage of 1.5 V at each gate and source thereof.

The voltage application state at a time of the data erasing of the word line driver 22 is the same as in the case of the word line driver 12; therefore, the description is omitted.

Every junction voltage Vj of the transistors TN1 to TN16 in each of the blocks BLK2 to BLK32 excluded from the data erasing shows 10 V. For example, however, when the operation environment is always at a low temperature, as far as the junction voltage Vj is assured to be 8V and less, this structure can be adopted.

Referring to FIG. 10, at a time of the data writing, each of the level shifters LS1 to LS16 of the word line driver 21 shifts the access signal in the range of 1.5 V to 0 V to the range of 1.5 V to −1.5 V and outputs the above. Each level shifter LSB1 of the word line driver 22 shifts the access signal in the range of 1.5 V to 0 V to the range of 6.5 V to 3.3 V and outputs the above. Each level shifter LSB2 of the word line driver 22 shifts the access signal in the range of 1.5 V to 0 V to the range of 3.3 V to 0 V and outputs the above.

In the block BLK1 portion of the word line driver 21, the signal of −1.5 V as the inversion output from the level shifter LS1 is supplied to the inverter INV1 and the signals of 1.5 V as the inversion outputs from the level shifters LS2 to LS16 are respectively supplied to the inverters INV2 to INV16. Further, the voltage of 1.5 V is supplied to the power terminal on the side of high potential of the inverters INV1 to INV16, and the voltage of −1.5 V is supplied to the power terminal on the side of low potential of the inverters INV1 to INV16 and the P well. Therefore, the inverter INV1 inverts the signal of −1.5 V into the signal of 1.5 V and outputs the above, and the inverters INV2 to INV16 invert the signals of 1.5 V into the signals of −1.5 V and output the above. Here, the transistor TN1 is turned off because of receiving the voltage of 1.5 V at the gate and source thereof. On the other hand, the signals of −1.5 V as the outputs from the inverters INV2 to INV16 are respectively supplied to the corresponding word lines WL2 to WL16.

In each portion of the blocks BLK2 to BLK32 of the word line driver 21, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the voltage of −1.5 V is supplied to the power terminal on the side of lower potential of the inverters INV1 to INV16 and the P well. Therefore, the inverters INV1 to INV16 invert the signals of 1.5 V into the signals of −1.5 V and output the above. The signals of −1.5 V as the outputs from the inverters INV1 to INV16 are respectively supplied to the corresponding word lines WL1 to WL16.

The voltage application state at a time of the data writing in the word line driver 22 is the same as that in the case of the word line driver 12; therefore, the description is omitted.

Here, for example, every junction voltage Vj of the transistors TN1 and TA2 to TA16 in the block BLK1 shows 8 V. Further, every junction voltage Vj of the transistors TA1 to TA16 in each of the block BLK2 to BLK32 shows 4.8 V. Also in every transistor following the word line drivers 21 and 22 other than the above, the junction voltage Vj is 8 V and less, the voltage Vds between each drain and source is 5 V and less, and the voltage Vgw between each gate and backgate is 5 V and less.

Referring to FIG. 11, at a time of the data reading, each of the level shifters LS1 to LS16 of the word line driver 21 shifts the access signal in the range of 1.5 V to 0 V to the range of 1.5 V to −2 V and outputs the above. Each of the level shifters LSB1 and LSB2 of the word line driver 22 shifts the access signal in the range of 1.5 V to 0 V to the range of 3.3 V to 0 V and outputs the above.

In the block BLK1 portion of the word line driver 21, the signal of −2 V as the inversion output from the level shifter LS1 is supplied to the inverter INV1 and the signals of 1.5 V as the inversion outputs from the level shifters LS2 to LS16 are respectively supplied to the inverters INV2 to INV16. Further, the voltage of 0 V is supplied to the power terminal on the side of high potential of the inverters INV1 to INV16, and the voltage of −2 V is supplied to the power terminal on the side of low potential of the inverters INV1 to INV16 and the P well. Therefore, the inverter INV1 inverts the signal of −2 V into the signal of 0 V and outputs the above, and the inverters INV2 to INV16 invert the signals of 1.5 V into the signals of −2 V and output the above. The signal of 0 V as the output from the inverter INV1 is supplied to the corresponding word line WL1 and the signals of −2 V as the outputs from the inverters INV2 to INV16 are respectively supplied to the word lines WL2 to WL16.

In each portion of the blocks BLK2 to BLK32 of the word line driver 21, the signals of 1.5 V as the inversion outputs from the level shifters LS1 to LS16 are respectively supplied to the inverters INV1 to INV16. Further, the voltage of 0 V is supplied to the power terminal on the side of high potential of the inverters INV1 to INV16, and the voltage of −2 V is supplied to the power terminal on the side of low potential of the inverters INV1 to INV16 and the P well. Therefore, the inverters INV1 to INV16 invert the signals of 1.5 V into the signals of −2 V and output the above. The signals of −2 V as the outputs from the inverters INV1 to INV16 are respectively supplied to the corresponding word lines WL1 to WL16.

The voltage application state at a time of the data reading of the word line driver 22 is the same as in the case of the word line driver 12; therefore, the description is omitted.

As mentioned above, at a time of the data reading, 512 word lines WL are driven only by the high speed operable word line driver 21. In all the transistors forming the word line drivers 21 and 22, the junction voltage Vj is 8 V and less, the voltage Vds between each drain and source is 5 V and less, and the voltage Vgw between each gate and backgate is 5 V and less.

Thus, the flash memory 2 shows the junction voltage Vj of 10 and less at a time of the data erasing; however, for example, when it is obvious that the junction voltage Vj is not more than the breakdown voltage of the low breakdown voltage transistor; for example, when the operational environment is always at a low temperature, the same effect as that of the flash memory 1 can be achieved. Further, the flash memory 2 makes the P well of the word line driver 11 in common and is not provided with the level shifter LSA1; therefore, an increase in the circuit size can be further suppressed.

The structure of the word line drivers 21 and 22 is not restricted to the above structure and it may be properly changed to the other structure having the same function without departing from the spirit. Further, the operation of the word line drivers 21 and 22 is not restricted to the above operation but it may be properly changed. Hereinafter, another voltage application state of the flash memory 2 will be briefly described.

(Another Voltage Application State at Data Erasing Time of Flash Memory 2)

Figure 12:
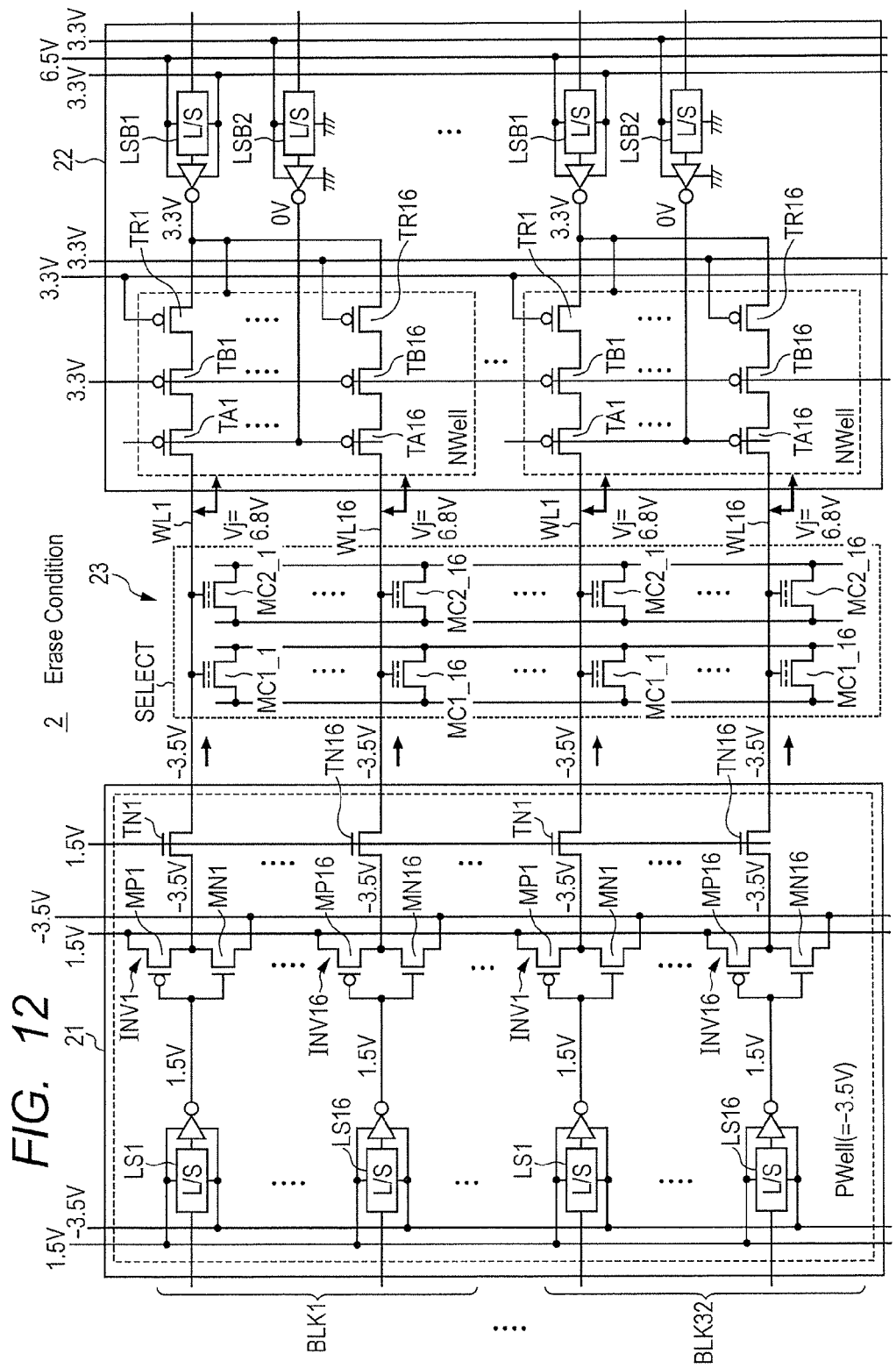
FIG. 12 is a view showing the other voltage application state at a time of data erasing in the flash memory shown in FIG. 8.

FIG. 12 is a view showing another voltage application state at a time of the data erasing of the flash memory 2. In the example of FIG. 12, at a time of the data erasing, the memory data of all the memory cells MC in each of the blocks BLK1 to BLK32 is erased together at once. Therefore, at a time of the data erasing, each of the blocks BLK2 to BLK32 is in the same voltage application state as the block BLK1.

According to this, at a time of the data erasing of the flash memory 2, the junction voltage Vj can be suppressed at 6.8 and less.

Third Embodiment

Figure 13:
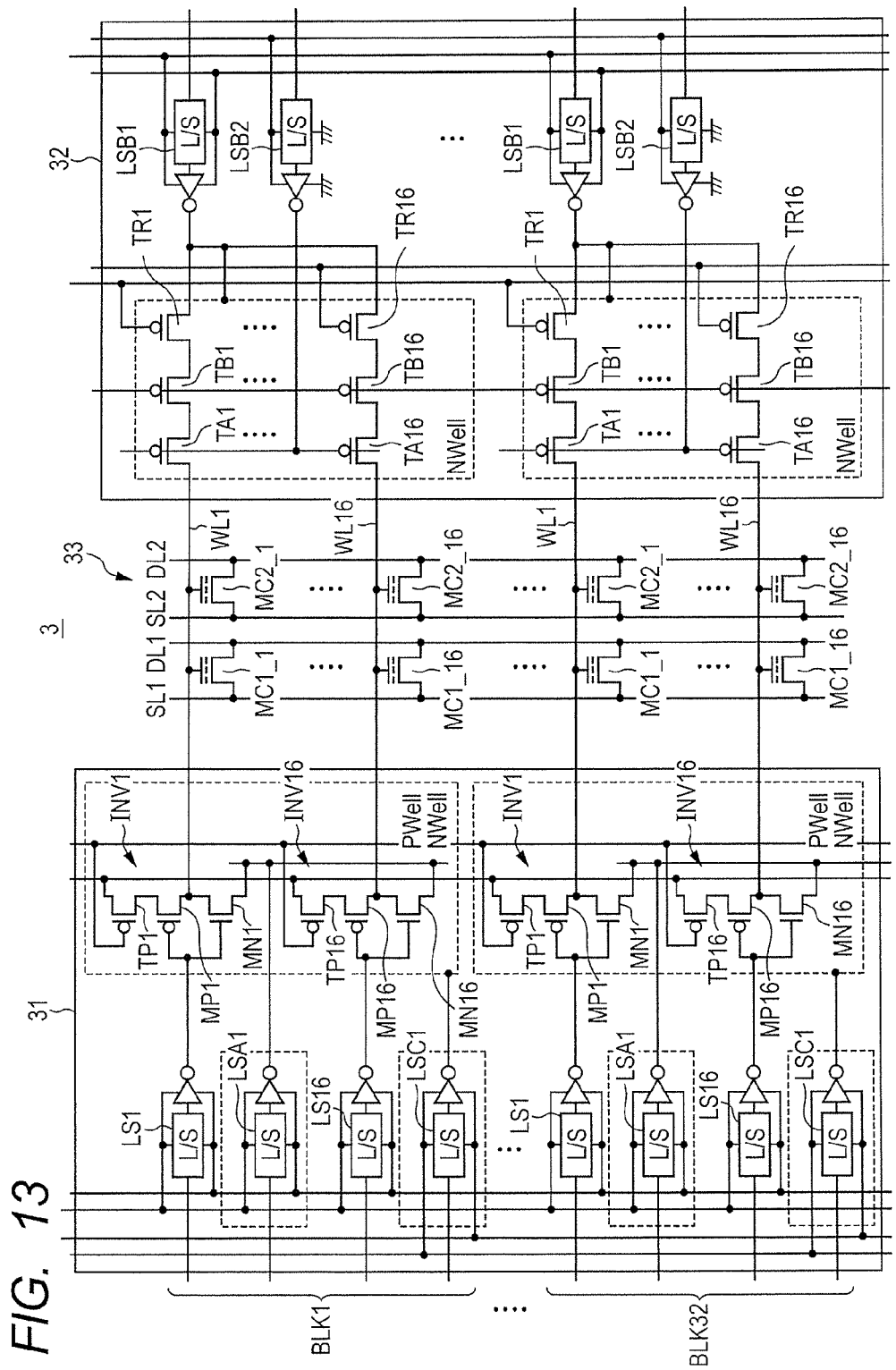
FIG. 13 is a view showing the constitutional example of a flash memory according to a third embodiment.

FIG. 13 is a view showing the constitutional example of a flash memory 3 according to a third embodiment. The flash memory 3 includes a memory cell array 33, word line drivers 31 and 32, a plurality of word lines WL, and a plurality of bit line pairs DL and SL. The memory cell array 33 and the word line drivers 31 and 32 respectively correspond to the memory cell array 13 and the word line drivers 11 and 12.

Compared with the word line driver 11, the word line driver 31 includes P channel MOS transistors TP1 to TP16 instead of the N channel MOS transistors TN1 to TN16 and further includes a level shifter LSC1, in each of the blocks BLK1 to BLK32.

In each of the blocks BLK1 to BLK32, the transistors TP1 to TP16 are provided in series to the P channel MOS transistor MP1 to MP16 forming the inverters INV1 to INV16 and a predetermined voltage (in the example, 6.5 V or 0 V) depending on the operation mode is applied to each gate. The transistors TP1 to TP16 are voltage relaxing transistors for preventing a high voltage from being applied to the inverters INV1 to INV16.

In each of the blocks BLK1 to BLK32, the level shifter LSC1 shifts the maximum voltage value and the minimum voltage value of an external access signal to a value depending on the operation mode and outputs the above to the N well forming the inverters INV1 to INV16.

The other structure of the word line driver 31 and the flash memory 3 having the above is the same as that of the word line driver 11 and the flash memory 1 having the above; therefore, the description is omitted. In each of the blocks BLK1 to BLK32, the level shifters LS1 to LS16 may not be provided.

(Voltage Application State in Each Operation Mode of Flash Memory 3)

Figure 14:
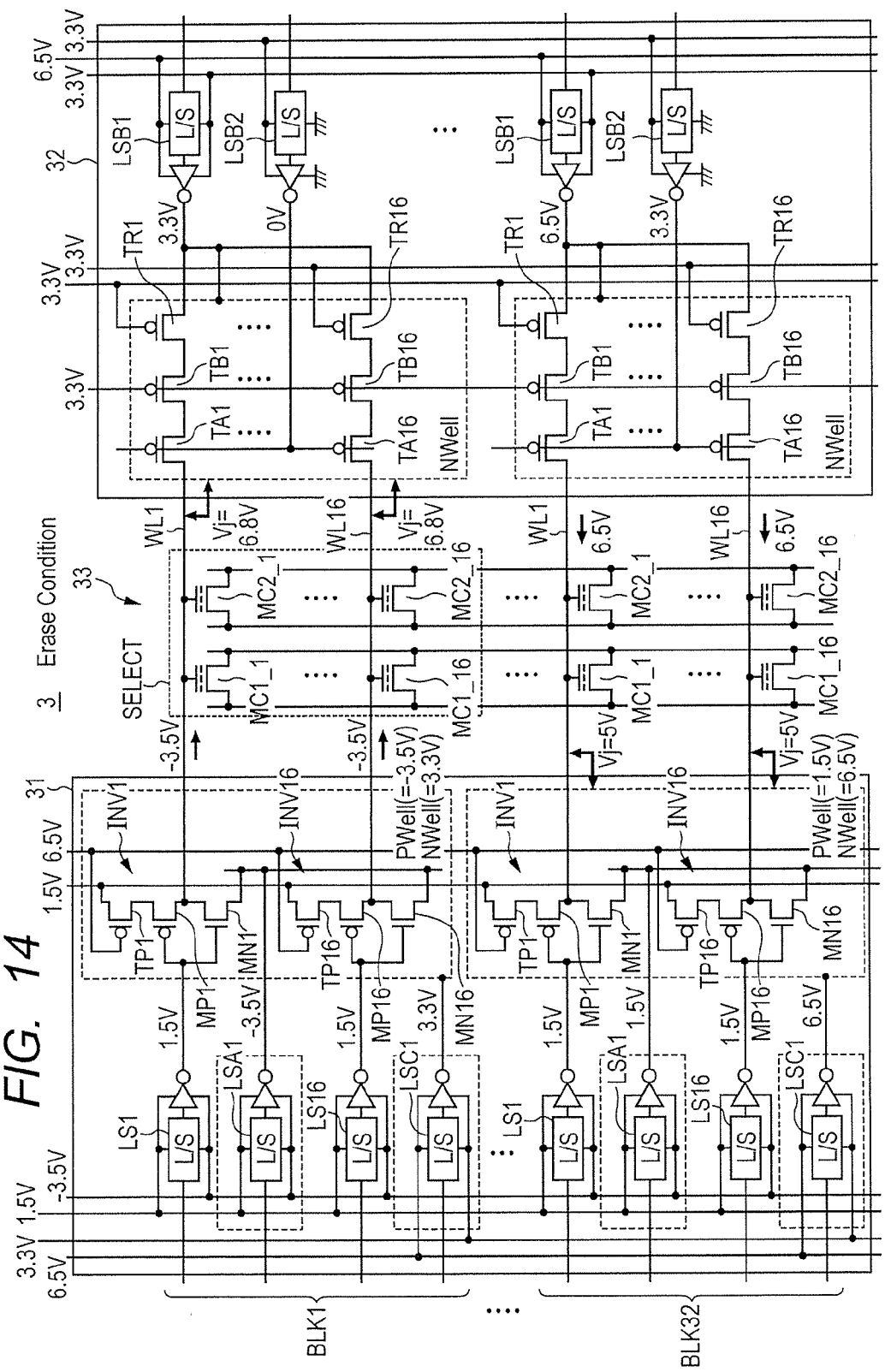
FIG. 14 is a view showing the voltage application state at a time of data erasing in the flash memory shown in FIG. 13.
Figure 15:
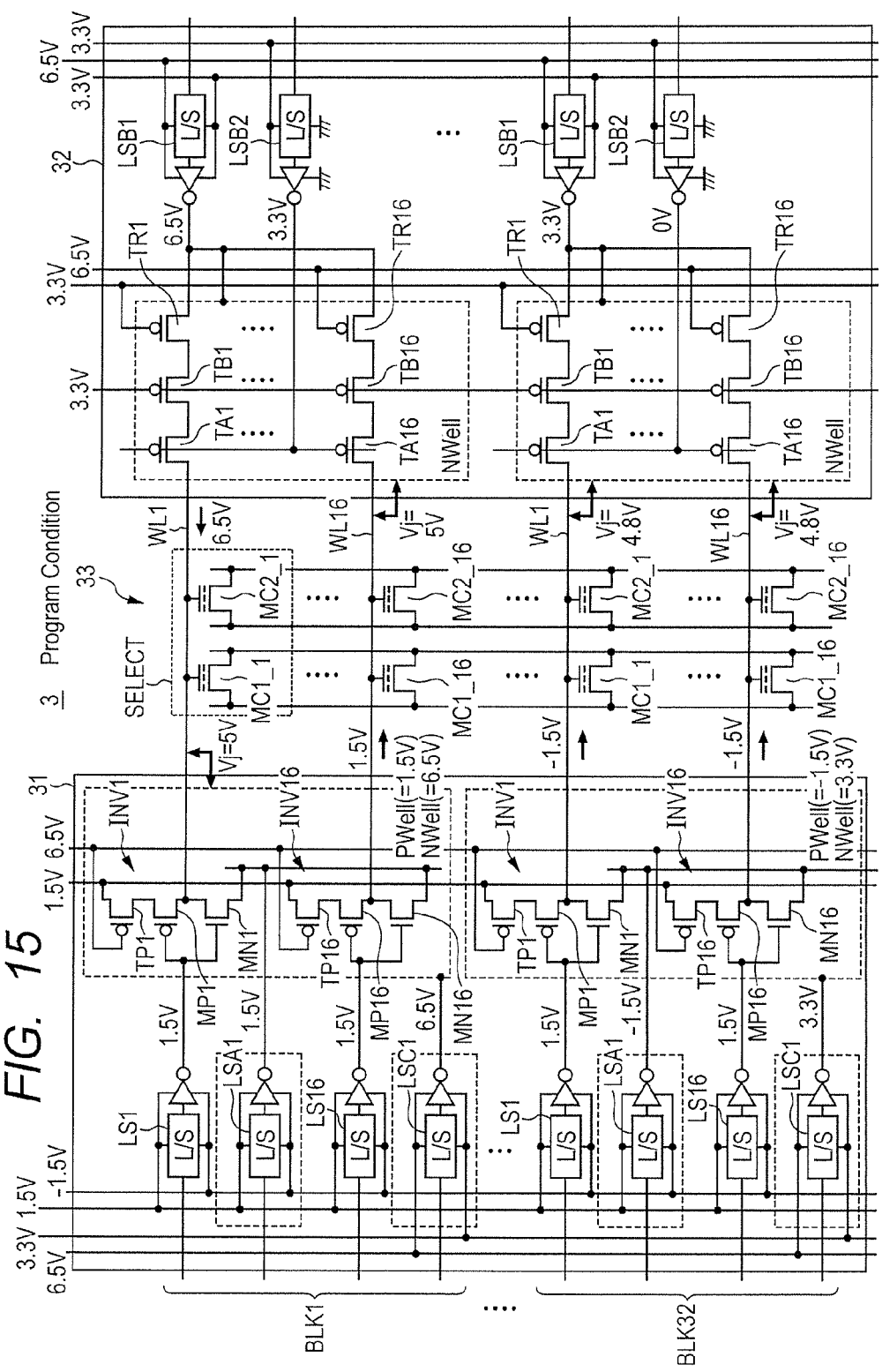
FIG. 15 is a view showing the voltage application state at a time of data writing in the flash memory shown in FIG. 13.
Figure 16:
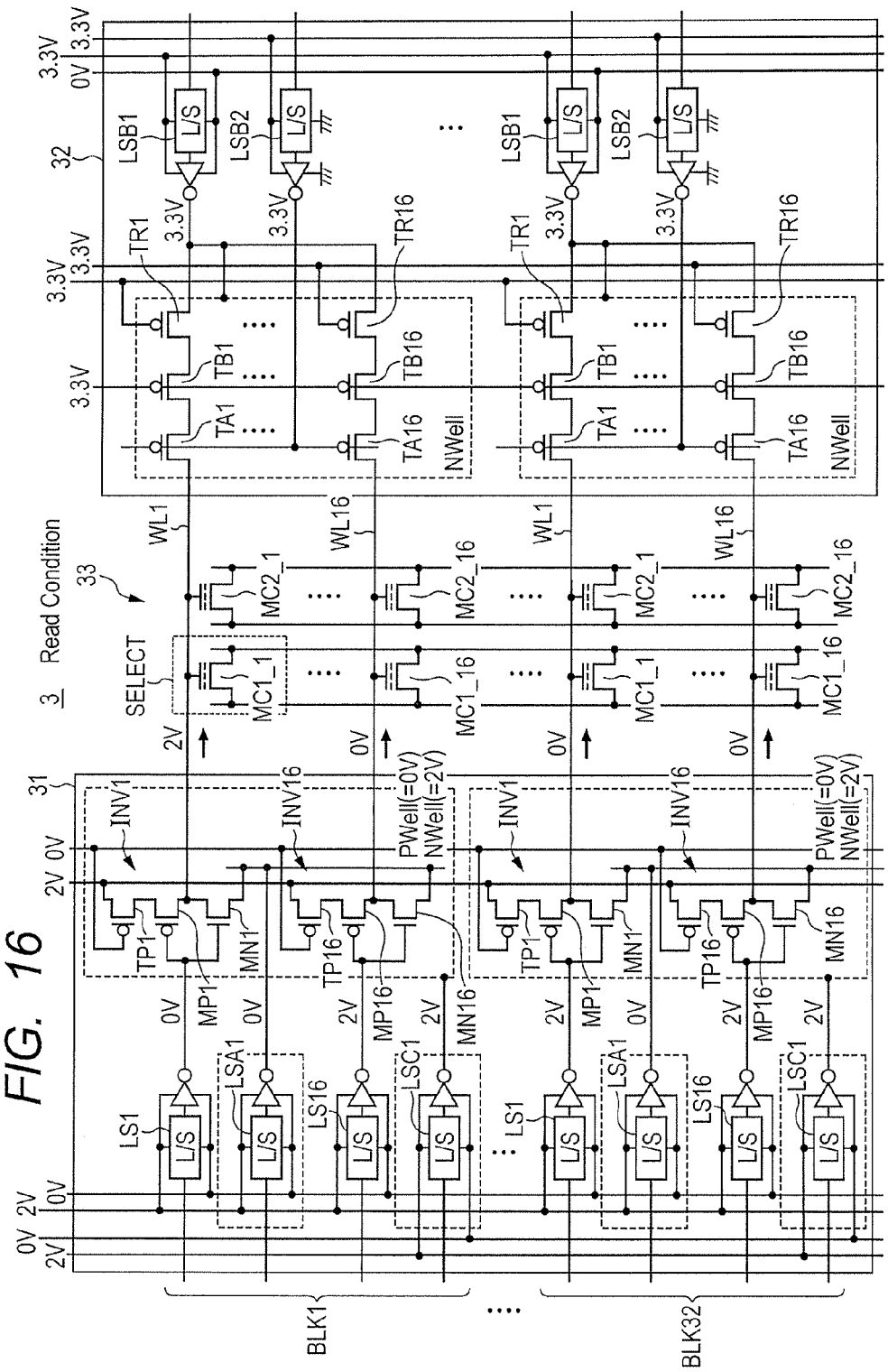
FIG. 16 is a view showing the voltage application state at a time of data reading in the flash memory shown in FIG. 13.

FIGS. 14 to 16 are views showing the voltage application state at a time of data erasing, data writing, and data reading of the flash memory 3. Hereinafter, a description will be made in the case of erasing the memory data of each memory cell MC in the block BLK1 at a time of the data erasing; writing data in each memory cell MC coupled to the word line WL1 in the block BLK1 at a time of the data writing; and reading the memory data of the memory cell MC1_1 in the block BLK1 at a time of the data reading.

Referring to FIG. 14, at a time of the data erasing, each of the level shifters LS1 to LS16 and LSA1 of the word line driver 31 shifts the access signal in the range of 1.5 V to 0 V to the range of 1.5 V to −3.5 V and outputs the above. Each level shifter LSC1 of the word line driver 31 shifts the access signal in the range of 1.5 V to 0 V to the range of 6.5 V to 3.3 V and outputs the above.

In the block BLK1 portion of the word line driver 31, the signals of 1.5 V as the inversion outputs from the level shifters LS1 to LS16 are respectively supplied to the inverters INV1 to INV16. The voltage of 1.5 V is supplied to the power terminal on the side of high potential of the inverters INV1 to INV16 and the signal of −3.5 V as the inversion output from the level shifter LSA1 is supplied to the power terminal on the side of low potential of the inverters INV1 to INV16 and the P well. Further, the voltage of 6.5 V is supplied to each gate of the transistors TP1 to TP16 and the signal of 3.3 V as the inversion output from the level shifter LSC1 is supplied to the N well. Therefore, the inverters INV1 to INV16 invert the signals of 1.5 V into the signals of −3.5 V and output the above. The signals of −3.5 V as the outputs from the inverters INV1 to INV16 are respectively supplied to the corresponding word lines WL1 to WL16.

In each portion of the blocks BLK2 to BLK32 of the word line driver 31, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16 and the signal of 1.5 V as the inversion output from the level shifter LSA1 is supplied to the power terminal on the side of low potential of the inverters INV1 to INV16 and the P well. Further, the voltage of 6.5 V is supplied to each gate of the transistors TP1 to TP16 and the signal of 6.5 V as the inversion output from the level shifter LSC1 is supplied to the N well. Therefore, all the outputs from the inverters INV1 to INV16 are in high impedance state.

The word line driver 32 is in the same voltage application state at a time of the data erasing as the word line driver 12; therefore, the description is omitted.

At this point, for example, every junction voltage Vj of the transistors TA1 to TA16 in the block BLK1 shows 6.8 V. Further, every junction voltage Vj of the transistors forming the inverters INV1 to INV16 in each of the blocks BLK2 to BLK32 shows 5 V. In every transistor forming the word line drivers 31 and 32 other than the above, the junction voltage Vj is 8 V and less, the voltage Vds between each drain and source is 5 V and less, and the voltage Vgw between each gate and backgate is 5 V and less.

Next, referring to FIG. 15, at a time of the data writing, each of the level shifters LS1 to LS16 and LSA1 of the word line driver 31 shifts the access signal in the range of 1.5 V to 0 V to the range of 1.5 V to −1.5 V and outputs the above. Further, each level shifter LSC1 of the word line driver 31 shifts the access signal in the range of 1.5 V to 0 V to the range of 6.5 V to 3.3 V and outputs the above.

In the block BLK1 portion of the word line driver 31, the signals of 1.5 V as the inversion outputs from the level shifters LS1 to LS16 are respectively supplied to the inverters INV1 to INV16. The voltage of 1.5 V is supplied to the power terminal on the side of high potential of the inverters INV1 to INV16 and the signal of 1.5 V as the inversion output from the level shifter LSA1 is supplied to the power terminal on the side of low potential of the inverters INV1 to INV16 and the P well. Further, the voltage of 6.5 V is supplied to each gate of the transistors TP1 to TP16 and the signal of 6.5 V as the inversion output from the level shifter LSC1 is supplied to the N well. Therefore, the output of the inverter INV1 is in a high impedance state. On the other hand, since the output of the word line driver 32 coupled to the word lines WL2 to WL16 is a high impedance (HiZ) in the inverters INV2 to INV16, the signals of 1.5 V are respectively output from the power terminal on the side of low potential. These 1.5 V signals are supplied to the corresponding word lines WL2 to WL16. Actually, each voltage applied to the word lines WL2 to WL16 shows a value lower than 1.5 V by each threshold voltage of the transistors MN2 to MN16; in the drawings, for the sake of simplicity, it is represented as 1.5 V.

In each portion of the blocks BLK2 to BLK32 of the word line driver 31, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16 and the signal of −1.5 V as the inversion output from the level shifter LSA1 is supplied to the power terminal on the side of low potential of the inverters INV1 to INV16 and the P well. Further, the voltage of 6.5 V is supplied to each gate of the transistors TP1 to TP16 and the signal of 3.3 V as the inversion output from the level shifter LSC1 is supplied to the N well. Therefore, the inverters INV1 to INV16 invert the signals of 1.5 V into the signals of −1.5 V and output the above. The signals of −1.5 V as the outputs from the inverters INV1 to INV16 are respectively supplied to the corresponding word lines WL1 to WL16.

The word line driver 32 is in the same voltage application state at a time of the data writing as the word line driver 12; therefore, the description is omitted.

At this point, for example, every junction voltage Vj of the transistors MP1, MN1, and TA2 to TA16 in the block BLK1 shows 5 V. Further, every junction voltage Vj of the transistors TA1 to TA16 in each of the blocks BLK2 to BLK32 shows 4.8 V. In every transistor forming the word line drivers 31 and 32 other than the above, the junction voltage Vj is 8 V and less, the voltage Vds between each drain and source is 5 V and less, and the voltage Vgw between each gate and backgate is 5 V and less.

Next, referring to FIG. 16, at a time of the data reading, each of the level shifters LS1 to LS16 and LSA1 of the word line driver 31 shifts the access signal in the range of 1.5 V to 0 V to the range of 2 V to 0 V and outputs the above. Further, each level shifter LSC1 of the word line driver 31 shifts the access signal in the range of 1.5 V to 0 V to the range of 2 V to 0 V and outputs the above.

In the block BLK1 portion of the word line driver 31, the signal of 0 V as the inversion output from the level shifter LS1 is supplied to the inverter INV1, and the signals of 2 V as the inversion outputs from the level shifters LS2 to LS16 are respectively supplied to the inverters INV2 to INV16. The voltage of 2 V is supplied to the power terminal on the side of high potential of the inverters INV1 to INV16 and the signal of 0 V as the inversion output from the level shifter LSA1 is supplied to the power terminal on the side of low potential of the inverters INV1 to INV16 and the P well. Further, the voltage of 0 V is supplied to each gate of the transistors TP1 to TP16, and the voltage of 2 V as the inversion output from the level shifter LSC1 is supplied to the N well. Therefore, the inverter INV1 inverts the signal of 0 V into the signal of 2 V and outputs the above, and the inverters INV2 to INV16 invert the signals of 2 V into the signals of 0 V and output the above. The signal of 2 V as the output from the inverter INV1 is supplied to the corresponding word line WL1 and the signals of 0 V as the outputs from the inverters INV2 to INV16 are respectively supplied to the corresponding word lines WL2 to WL16.

In each portion of the blocks BLK2 to BLK32 of the word line driver 31, the signals of 2 V as the inversion outputs from the level shifters LS1 to LS16 are respectively supplied to the inverters INV1 to INV16. Further, the voltage of 2 V is supplied to the power terminal on the side of high potential of the inverters INV1 to INV16 and the signal of 0 V as the inversion output from the level shifter LSA1 is supplied to the power terminal on the side of low potential of the inverters INV1 to INV16 and the P well. Further, the voltage of 0 V is supplied to each gate of the transistors TP1 to TP16 and the signal of 2 V as the inversion output from the level shifter LSC1 is supplied to the N well. Therefore, the inverters INV1 to INV16 invert the signals of 2 V into the signals of 0 V and output the above. The signals of 0 V as the outputs from the inverters INV1 to INV16 are respectively supplied to the corresponding word lines WL1 to WL16.

In the block BLK1 portion of the word line driver 32, the signal of 3.3 V as the inversion output from the level shifter LSB1 is supplied to each source of the transistors TR1 to TR16 and the N well. The transistors TR1 to TR16 are turned off because the voltage supplied to each gate and source is less than the threshold voltage. The signal of 3.3 V as the inversion output from the level shifter LSB2 is supplied to each gate of the transistors TA1 to TA16. The voltage of 3.3 V is supplied to each gate of the transistors TB1 to TB16.

In each portion of the blocks BLK2 to BLK32 of the word line driver 32, the signal of 3.3 V as the inversion output from the level shifter LSB1 is supplied to each source of the transistors TR1 to TR16 and the N well. Here, the transistors TR1 to TR16 are turned off because the voltage supplied to each gate and source is less than the threshold voltage. The signal of 3.3 V as the inversion output from the level shifter LSB2 is supplied to each gate of the transistors TA1 to TA16. The voltage of 3.3 V is supplied to each gate of the transistors TB1 to TB16.

As mentioned above, at a time of the data reading, 512 word lines WL are driven only by the high speed operable word line driver 31. In every transistor forming the word line drivers 31 and 32, the junction voltage Vj is 8 V and less, the voltage Vds between each drain and source is 5 V and less, and the voltage Vgw between each gate and backgate is 5 V and less.

As mentioned above, the flash memory 3 according the embodiment can achieve the same effect as that of the flash memory 1. The flash memory 3 according to the embodiment can gain access to the memory cell MC by using a positive voltage at a time of the data reading.

The structure of the word line drivers 31 and 32 is not restricted to the above mentioned structure but it may be properly changed to other structure having the same function without departing from the spirit.

Fourth Embodiment

Figure 17:
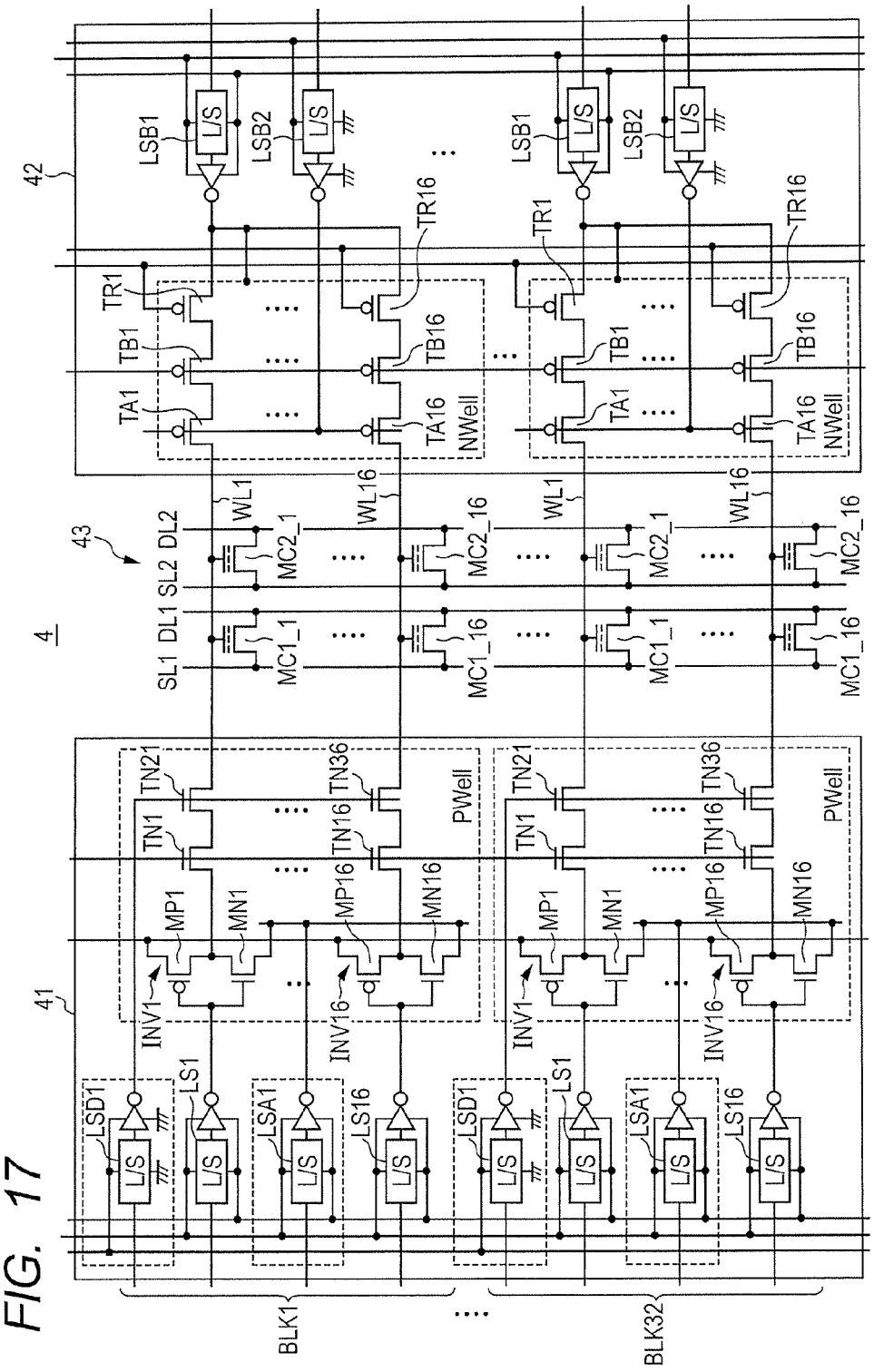
FIG. 17 is a view showing the constitutional example of a flash memory according to a fourth embodiment.

FIG. 17 is a view showing the constitutional example of a flash memory 4 according to a fourth embodiment. The flash memory 4 includes a memory cell array 43, word line drivers 41 and 42, a plurality of word lines WL, and a plurality of bit line pairs DL and SL. The memory cell array 43 and the word line drivers 41 and 42 respectively correspond to the memory cell array 13 and the word line drivers 11 and 12.

Compared to the word line driver 11, the word line driver 41 further includes N channel MOS transistors TN21 to TN36 and the level shifter LSD1 in each of the blocks BLK1 to BLK32.

In each of the blocks BLK1 to BLK32, the respective transistors TN21 to TN36 are provided in series to the respective transistors TN1 to TN16 and the inversion output from the level shifter LSD1 is supplied to each gate. The transistors TN21 to TN36 are voltage relaxing transistors similarly to the transistors TN1 to TN16.

The structure of the word line driver 41 and the flash memory 4 having the above is the same as that of the word line driver 11 and the flash memory 1 having the above; therefore, the description is omitted.
(Voltage Application State in Each Operation Mode of Flash Memory 4)

Figure 18:
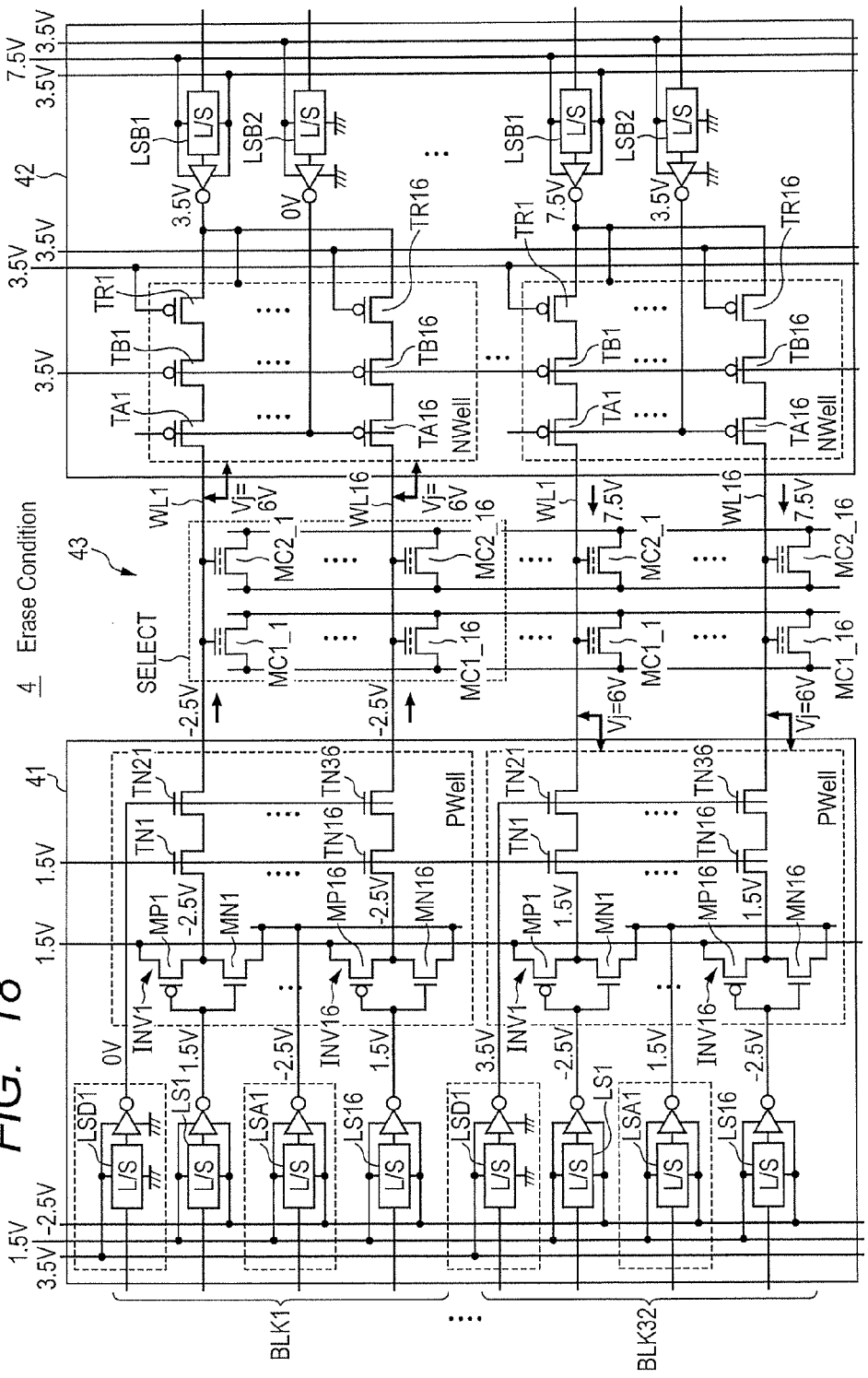
FIG. 18 is a view showing the voltage application state at a time of data erasing in the flash memory shown in FIG. 17.
Figure 19:
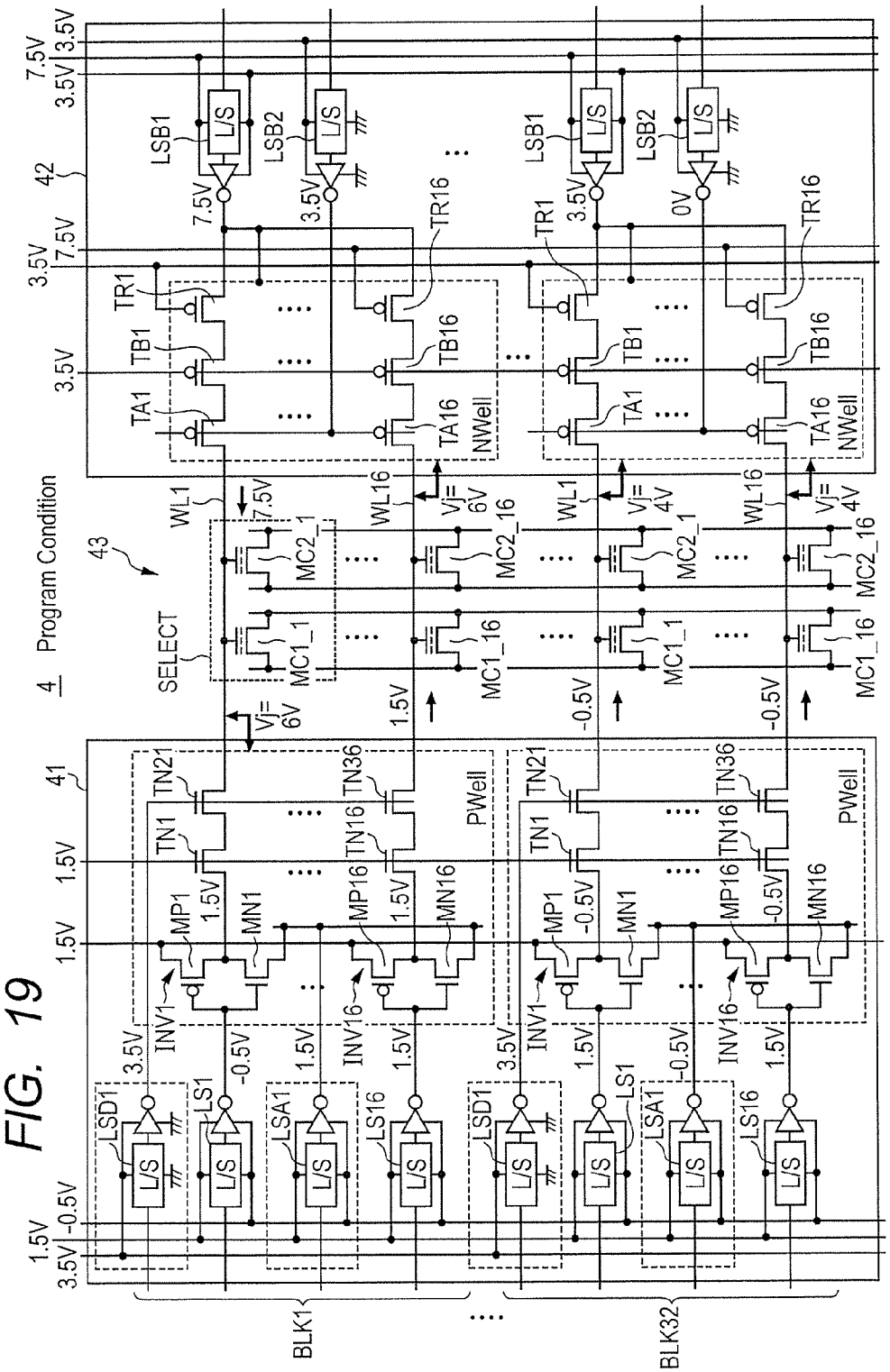
FIG. 19 is a view showing the voltage application state at a time of data writing in the flash memory shown in FIG. 17.
Figure 20:
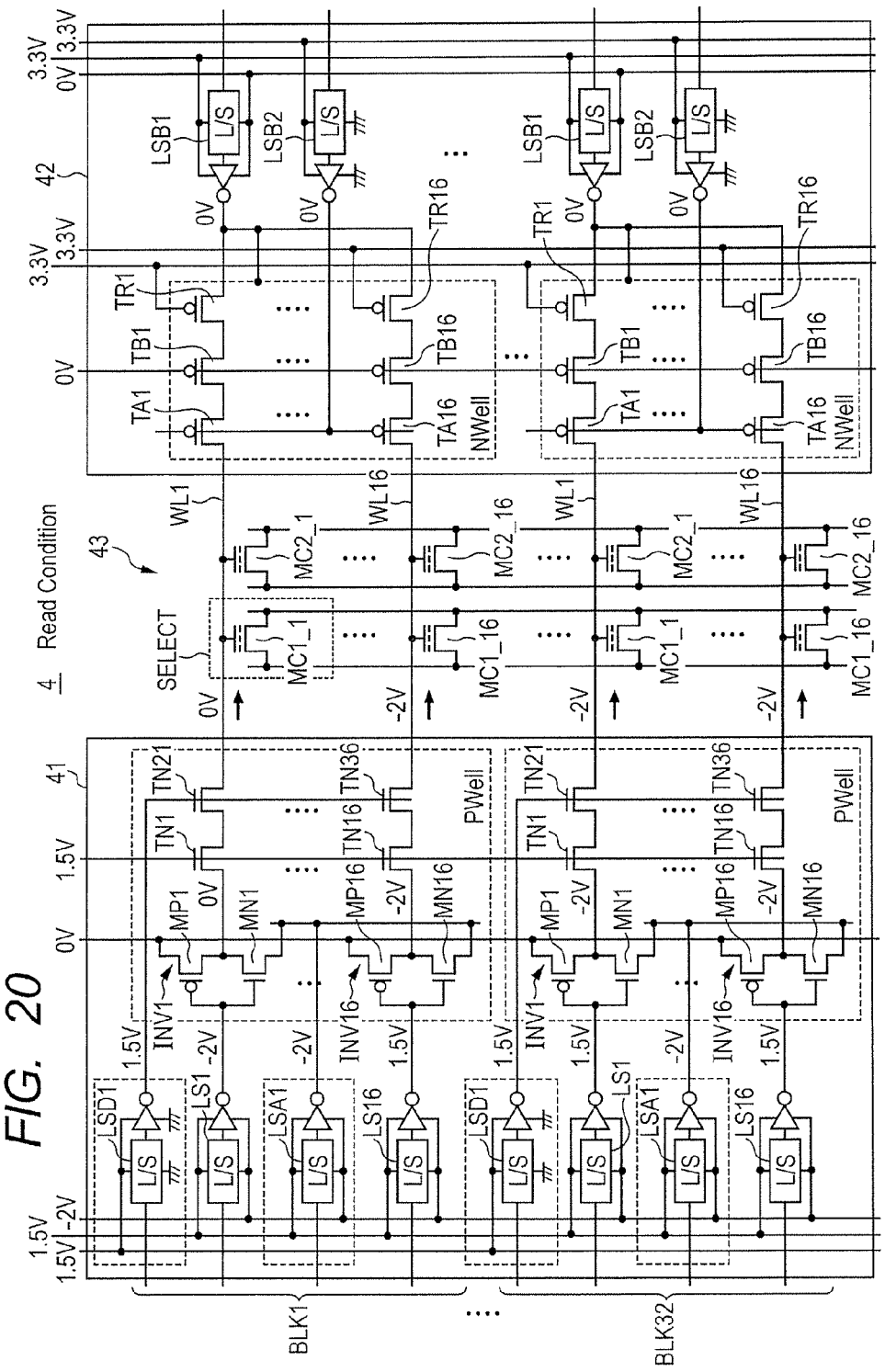
FIG. 20 is a view showing the voltage application state at a time of data reading in the flash memory shown in FIG. 17.

FIGS. 18 to 20 show the voltage application state at a time of data erasing, data writing, and data reading of the flash memory 2. Hereinafter, a description will be made in the case of erasing the memory data of each memory cell MC in the block BLK1 at a time of data erasing, writing the data in each memory cell MC coupled to the word line WL1 in the block BLK1 at a time of data writing, and reading the memory data of the memory cell MC1_1 in the block BLK1 at a time of data reading.

At first, referring to FIG. 18, at a time of data erasing, each of the level shifters LS1 to LS16 and LSA1 of the word line driver 41 shifts the access signal in the range of 1.5 V to 0 V to the range of 1.5 V to −2.5 V and outputs the above. Each level shifter LSD1 of the word line driver 41 shifts the access signal in the range of 1.5 V to 0 V to the range of 3.5 V to 0 V and outputs the above. Each level shifter LSB1 of the word line driver 42 shifts the access signal in the range of 1.5 V to 0 V to the range of 7.5 V to 3.5 V. Each level shifter LSB2 of the word line driver 42 shifts the access signal in the range of 1.5 V to 0 V to the range of 3.5 V to 0 V.

In the block BLK1 portion of the word line driver 41, the signals of 1.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16, and the voltage of −2.5 V is supplied to the power terminal on the side of low potential of the inverters INV1 to INV16 and the P well. Therefore, the inverters INV1 to INV16 invert the signals of 1.5 V into the signals of −2.5 V and output the above. The voltage of 1.5 V is supplied to each gate of the transistors TN1 to TN16 and the signal of 0 V as the inversion output from the level shifter LSD1 is supplied to each gate of the transistors TN21 to TN36. Therefore, the signals of −2.5 V as the outputs from the inverters INV1 to INV16 are respectively supplied to the corresponding word lines WL1 to WL16.

In each portion of the blocks BLK2 to BLK32 of the word line driver 41, the signals of −2.5 V as the inversion outputs from the level shifters LS1 to LS16 are respectively supplied to the inverters INV1 to INV16. Further, the voltage of 1.5 V is supplied to the power terminal on the side of high potential of the inverters INV1 to INV16 and the signal of 1.5 V as the inversion output from the level shifter LSA1 is supplied to the power terminal on the side of low potential of the inverters INV1 to INV16 and the P well. Therefore, the inverters INV1 to INV16 shift the signals of −2.5 V into the signals of 1.5 V and output the above. Here, the transistors TN1 to TN16 are turned off because of receiving the voltage of 1.5 V at each gate and source thereof. The signal of 3.5 V as the inversion output from the level shifter LSD1 is supplied to each gate of the transistors TN21 to TN36.

In the block BUG portion of the word line driver 42, the signal of 3.5 V as the inversion output from the level shifter LSB1 is supplied to each source of the transistors TR1 to TR16 and the N well. Here, the transistors TR1 to TR16 are turned off because of receiving the voltage of 3.5 V at each gate and source thereof. The signal of 0 V as the inversion output from the level shifter LSB2 is supplied to each gate of the transistors TA1 to TA16. The voltage of 3.5 V is supplied to each gate of the transistors TB1 to TB16.

In each portion of the blocks BLK2 to BLK32 of the word line driver 42, the signal of 7.5 V as the inversion output from the level shifter LSB1 is supplied to each source of the transistors TR1 to TR16 and the N well. Further, the signal of 3.5 V as the inversion output from the level shifter LSB2 is supplied to each gate of the transistors TA1 to TA16. The voltage of 3.5 V is supplied to each gate of the transistors TB1 to TB16. Therefore, the transistors TR1 to TR16, TB1 to TB16, and TA1 to TA16 are turned on. Therefore, the signal of 7.5 V as the inversion output from the level shifter LSB1 is supplied to the corresponding word line of WL1 to WL16.

At this time, for example, every junction voltage Vj of the transistors TA1 to TA16 in the block BLK1 shows 6 V. Further, every junction voltage Vj of the transistors TN21 to TN36 in each of the blocks BLK2 to BLK32 shows 6 V. In every transistor faulting the word line drivers 41 and 42 other than the above, the junction voltage Vj is 8 V and less, the voltage Vds between each drain and source is 5 V and less, and the voltage Vgw between each gate and backgate is 5 V and less.

Next, referring to FIG. 19, at a time of the data writing, each of the level shifters LS1 to LS16 and LSA1 of the word line driver 41 shift the access signal in the range of 1.5 V to 0 V to the range of 1.5 V to −0.5 V and output the above. Each level shifter LSD1 of the word line driver 41 shifts the access signal in the range of 1.5 V to 0 V to the range of 3.5 V to 0 V and outputs the above. Each level shifter LSB1 of the word line driver 42 shifts the access signal in the range of 1.5 V to 0 V to the range of 7.5 V to 3.5 V and outputs the above. Further, each level shifter LSB2 of the word line driver 42 shifts the access signal in the range of 1.5 V to 0 V to the range of 3.5 V to 0 V and outputs the above.

In the block BLK1 portion of the word line driver 41, the signal of V as the inversion output from the level shifter LS1 is supplied to the inverter INV1 and the signals of 1.5 V as the inversion outputs from the level shifters LS2 to LS16 is supplied to the inverters INV2 to INV16. Further, the voltage of 1.5 V is supplied to the power terminal on the side of high potential of the inverters INV1 to INV16 and the signal of 1.5 V as the inversion output from the level shifter LSA1 is supplied to the power terminal on the side of low potential of the inverters INV1 to INV16 and the P well. Accordingly, the inverter INV1 inverts the signal of −0.5 V into the signal of 1.5 V and outputs the above, and the inverters INV2 to INV16 invert the signals of 1.5 V into the signals of 1.5 V and output the above. The voltage of 1.5 V is supplied to each gate of the transistors TN1 to TN16 and the signal of 3.5 V as the inversion output from the level shifter LSD1 is supplied to each gate of the transistors TN21 to TN36. Here, the transistor TN1 is turned off because of receiving the voltage of 1.5 V at the gate and source thereof. On the other hand, the signals of 1.5 V as the outputs from the inverters INV2 to INV16 are respectively supplied to the corresponding word lines WL2 to WL16 because the output of the word line driver 42 coupled to the word lines WL2 to WL16 is a high impedance (HiZ). Actually, the voltage applied to each of the word lines WL2 to WL16 shows a value lower than 1.5 V by each threshold voltage of the transistors TN2 to TN16; however, for the sake of simplicity on the drawings, it is represented as 1.5 V.

In each portion of the blocks BLK2 to BLK32 of the word line driver 41, the signals of 1.5 V as the inversion outputs from the level shifters LS1 to LS16 are respectively supplied to the inverters INV1 to INV16. The voltage of 1.5 V is supplied to the power terminal on the side of high potential of the inverters INV1 to INV16 and the signal of −0.5 V as the inversion output from the level shifter LSA1 is supplied to the power terminal on the side of low potential of the inverters INV1 to INV16 and the P well. Accordingly, the inverters INV1 to INV16 shift the signals of 1.5 V into the signals of −0.5 V and output the above. The voltage of 1.5 V is supplied to each gate of the transistors TN1 to TN16 and the signal of 3.5 V as the inversion output from the level shifter LSD1 is supplied to each gate of the transistors TN21 to TN36. Therefore, the signals of −0.5 V as the outputs from the inverters INV1 to INV16 are respectively supplied to the corresponding word lines WL1 to WL16.

In the block BLK1 portion of the word line driver 42, the signal of 7.5 V as the inversion output from the level shifter LSB1 is supplied to each source of the transistors TR1 to TR16 and the N well. Here, the transistor TR1 is turned on because the voltage supplied to the gate and source is the threshold voltage and more. On the other hand, the transistors TR2 to TR16 are turned off because the voltage of 7.5 V is supplied to each gate and source thereof. The signal of 3.5 V as the inversion output from the level shifter LSB2 is supplied to each gate of the transistors TA1 to TA16. The voltage of 3.5 V is supplied to each gate of the transistors TB1 to TB16. Therefore, the signal of 7.5 V as the inversion output from the level shifter LSB1 is supplied to only the corresponding word line WL1.

In each portion of the blocks BLK2 to BLK32 of the word line driver 42, the signal of 3.5 V as the inversion output from the level shifter LSB1 is supplied to each source of the transistors TR1 to TR16 and the N well. Here, the transistors TR1 to TR16 are turned off because the voltage supplied to each gate and source is less than the threshold voltage. The signal of 0 V as the inversion output from the level shifter LSB2 is supplied to each gate of the transistors TA1 to TA16. The voltage of 3.5 V is supplied to each gate of the transistors TB1 to TB16.

At this time, for example, in the transistors TN21, TA2 to TA16 in the block BLK1, every junction voltage Vj shows 6 V. In the transistors TA1 to TA16 in each of the blocks BLK2 to BLK32, every junction voltage Vj shows 4 V. Also in every transistor forming the word line drivers 41 and 42 other than the above, the junction voltage Vj is 8 V and less, the voltage Vds between each drain and source is 5 V and less, and the voltage Vgw between each gate and backgate is 5 V and less.

Next, referring to FIG. 20, at a time of the data reading, in each portion of the blocks BLK1 to BLK32 of the word line driver 41, the signal of 1.5 V as the inversion output from the level shifter LSB2 is supplied to every gate of the transistors TN21 to TN36. The other voltage application state at a time of the data reading of the word line drivers 41 and 42 is the same as in the case of the word line drivers 11 and 12; therefore, the description is omitted.

As mentioned above, at a time of the data reading, 512 word lines WL are driven only by the high speed operable word line driver 41. In every transistor forming the word line drivers 41 and 42, the junction voltage Vj is 8 V and less, the voltage Vds between each drain and source is 5 V and less, and the voltage Vgw between each gate and backgate is 5 V and less.

As mentioned above, the flash memory 4 according to the embodiment can achieve the same effect as that of the flash memory 1. The flash memory 4 according to the embodiment is provided with two stages of the voltage relaxing transistors in each inverter INV of the word line driver 41, hence to reduce the junction voltage Vj of the transistor and at the same time, to reduce the voltage Vds between the drain and source of the transistor and the voltage Vgw between the gate and backgate to 4 V and less. As the result, the word line drivers 41 and 42 can be formed by the transistor of lower breakdown voltage of 4 V and less.

The structure of the word line drivers 41 and 42 is not restricted to the above structure but it may be properly changed to other structure having the same function without departing from the spirit.

As mentioned above, the flash memory according to the first to fourth embodiments generates a high voltage to be applied to the memory cell MC at a time of the data writing by using two word line drivers. The flash memory according to the first to fourth embodiments can form the two word line drivers only by using a low breakdown voltage transistor without using a high breakdown voltage transistor, hence to suppress an increase in the manufacturing process and as the result, to reduce the manufacturing cost.

Further, the flash memory according to the first to fourth embodiments can realize a higher speed operation by forming the two word line drivers of a low breakdown voltage transistor than in the case of forming the word line drivers of a high breakdown voltage.

Further, at a time of the data reading, the flash memory according to the first to fourth embodiments uses the two word line drivers properly depending on the operation mode; for example, at a time of the data reading, only one word line driver is used to drive the word lines. Therefore, the flash memory according to the first to the fourth embodiments can layout the circuit efficiently, hence to suppress an increase in the circuit size. Specifically, for example, the word line driver 42 is formed by a transistor of small size because there needs no high speed operation.

As mentioned above, although the invention made by the inventor et al. has been described based on the embodiments, the invention is not restricted to the embodiments having been described but it is needless to say that various modifications can be made without departing from the spirit.

For example, in the semiconductor device according to the above embodiments, the conductive type (p-type or n-type) of a semiconductor substrate, a semiconductor layer, and a diffusion layer (diffused area) may be inverted. Therefore, when one of the n-type and the p-type is a first conductive type and the other is a second conductive type, the first conductive type can be the p-type and the second conductive type can be the n-type or on the contrary, the first conductive type can be the n-type and the second conductive type can be the p-type.

What is claimed is:

1. A flash memory comprising:
   a memory cell array formed by a plurality of memory cells arranged in a matrix shape;
   a plurality of word lines provided in each column of the memory cell array;
   a first word line driver that outputs a first voltage group to each of the plurality of word lines; and
   a second word line driver that outputs a second voltage group to each of the word lines together with the first word line driver, wherein the first word line driver includes:
   a plurality of first level shifters, each level shifter provided to a corresponding word line, a plurality of inverters that drive outputs of the respective first level shifters, and a plurality of first voltage relaxing transistors that relax voltages applied to a respective inverter, each of the first voltage relaxing transistors comprising an N channel type MOS transistors provided in an output stage of a respective inverter.

2. The flash memory according to claim 1, wherein the first word line driver and the second word line driver are arranged oppositely with the memory cell array interposed therebetween.

3. The flash memory according to claim 1,
   wherein a breakdown voltage of each transistor forming the first and the second word line drivers is smaller than a breakdown voltage of each transistor forming the memory cell array.

4. The flash memory according to claim 1,
   wherein a breakdown voltage of each transistor forming the first and the second word line drivers is a same breakdown voltage as a breakdown voltage of each transistor forming a peripheral circuit other than the memory cell array.

5. The flash memory according to claim 1,
   wherein the inverters are separately formed on a plurality of P wells provided individually in every unit of the memory cells targeted for memory data erasing at once, and
   wherein the first word line driver includes a P well from the plurality of P wells, and further a plurality of second level shifters that supply a common potential to each source of an NMOS transistor, of respective PMOS and NMOS transistors forming the respective inverters formed on the P well.

6. The flash memory according to claim 1,
   wherein the inverters are all formed on a common P well, and
   wherein a common potential is supplied to the common P well and each source of an NMOS transistor, of respective PMOS and NMOS transistors forming the respective inverters.

7. The flash memory according to claim 1,
   wherein the inverters are separately formed on a plurality of P wells provided individually in every unit of the memory cells targeted for memory data erasing at once,
   wherein the first word line driver includes a P well from the plurality of P wells, a plurality of second level shifters that supply a common potential to each source of an NMOS transistor, of respective PMOS and NMOS transistors forming the respective inverters formed on the P well, and
   further a plurality of third level shifters that separately supply a potential to a plurality of N wells provided correspondingly to the plurality of P wells, and
   wherein the first voltage relaxing transistors are P channel type MOS transistors provided on a source side of a PMOS transistor, of respective PMOS and NMOS transistors forming the respective inverters.

8. The flash memory according to claim 1,
   wherein the first word line driver includes
   a plurality of inverters that control respective voltage levels of the word lines, and
   a plurality of first voltage relaxing transistors that relax voltages applied to the respective inverters,
   wherein the inverters are separately formed on a plurality of P wells provided individually in every unit of the memory cells targeted for memory data erasing at once, wherein the first word line driver includes a P well from the plurality of P wells, a plurality of second level shifters that supply a common potential to each source of an NMOS transistor, of respective PMOS and NMOS transistors forming the respective inverters formed on the above P well, and further a plurality of third level shifters that separately supply a potential to a plurality of N wells provided correspondingly to the plurality of P wells, and wherein the first voltage relaxing transistors are P channel type MOS transistors provided on a source side of a PMOS transistor, of respective PMOS and NMOS transistors forming the respective inverters.

9. The flash memory according to claim 5, wherein the first word line driver further includes a plurality of second voltage relaxing transistors, each coupled in series to a respective first voltage relaxing transistor and a plurality of third level shifters that supply a potential to each gate of the second voltage relaxing transistors.

10. The flash memory according to claim 1, wherein the second word line driver includes a plurality of second level shifters provided in every unit of the memory cells targeted for memory data erasing at once, and a plurality of select circuits that selectively output each output of the second level shifters to one of the word lines corresponding to the second level shifters.

11. The flash memory according to claim 10, wherein the second word line driver further includes a plurality of second voltage relaxing transistors respectively between the select circuits and the word lines.

* * * * *